United States Patent
Ooyabu et al.

(10) Patent No.: US 8,053,674 B2
(45) Date of Patent: Nov. 8, 2011

(54) WIRED CIRCUIT BOARD

(75) Inventors: Yasunari Ooyabu, Osaka (JP); Jun Ishii, Osaka (JP); Naohiro Terada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 664 days.

(21) Appl. No.: 11/882,667

(22) Filed: Aug. 3, 2007

(65) Prior Publication Data

US 2008/0029293 A1    Feb. 7, 2008

Related U.S. Application Data

(60) Provisional application No. 60/847,095, filed on Sep. 26, 2006.

(30) Foreign Application Priority Data

Aug. 4, 2006  (JP) .................................. 2006-213776

(51) Int. Cl.
H05K 1/00        (2006.01)
(52) U.S. Cl. .......................... 174/254; 361/748; 361/741
(58) Field of Classification Search ............... 360/245.9; 361/748, 741; 174/254; 204/192.14; 29/830
See application file for complete search history.

(56) References Cited

U.S. PATENT DOCUMENTS

| | | | |
|---|---|---|---|
| 5,340,641 A | 8/1994 | Xu | |
| 5,346,765 A | 9/1994 | Maeda et al. | |
| 5,812,349 A | 9/1998 | Shouji et al. | |
| 6,163,443 A | 12/2000 | Hatagami et al. | |
| 6,373,709 B1 | 4/2002 | Hino et al. | |
| 6,459,043 B1 * | 10/2002 | Dodsworth | 174/254 |
| 6,731,476 B1 | 5/2004 | Motonishi et al. | |
| 6,891,700 B2 * | 5/2005 | Shiraishi et al. | 360/245.9 |
| 2003/0089520 A1 | 5/2003 | Ooyabu et al. | |
| 2004/0221447 A1 | 11/2004 | Ishii et al. | |
| 2006/0187587 A1 * | 8/2006 | Arai et al. | 360/245.9 |
| 2006/0190673 A1 * | 8/2006 | Arai et al. | 711/101 |

FOREIGN PATENT DOCUMENTS

| | | |
|---|---|---|
| CN | 1610486 A | 4/2005 |
| CN | 1649110 | 8/2005 |
| GB | 2310309 A | 8/1997 |
| JP | 5-8339 | 1/1993 |
| JP | 08-153940 | 6/1996 |
| JP | 9-223304 | 8/1997 |
| JP | 11-238218 | 8/1999 |
| JP | 2000-142786 | 5/2000 |
| JP | 2000-306220 | 11/2000 |
| JP | 2001-44625 | 2/2001 |
| JP | 2001-200217 | 7/2001 |
| JP | 2001-358417 A | 12/2001 |
| JP | 2002-56513 | 2/2002 |
| JP | 2003-152383 | 5/2003 |
| JP | 2004-335700 | 11/2004 |
| JP | 2006-93228 | 4/2006 |

* cited by examiner

*Primary Examiner* — Tuan T Dinh
*Assistant Examiner* — Steven Sawyer
(74) *Attorney, Agent, or Firm* — Jean C. Edwards, Esq.; Edwards Neils PLLC

(57) ABSTRACT

A wired circuit board includes a wired circuit body portion having a wired circuit, an electrostatic charge removing portion conducted with the wired circuit body portion and having a semiconductive layer, and a conduction cut-off portion arranged between the wired circuit body portion and the electrostatic charge removing portion to cut off electrical conduction therebetween.

7 Claims, 10 Drawing Sheets

[Fig. 1]
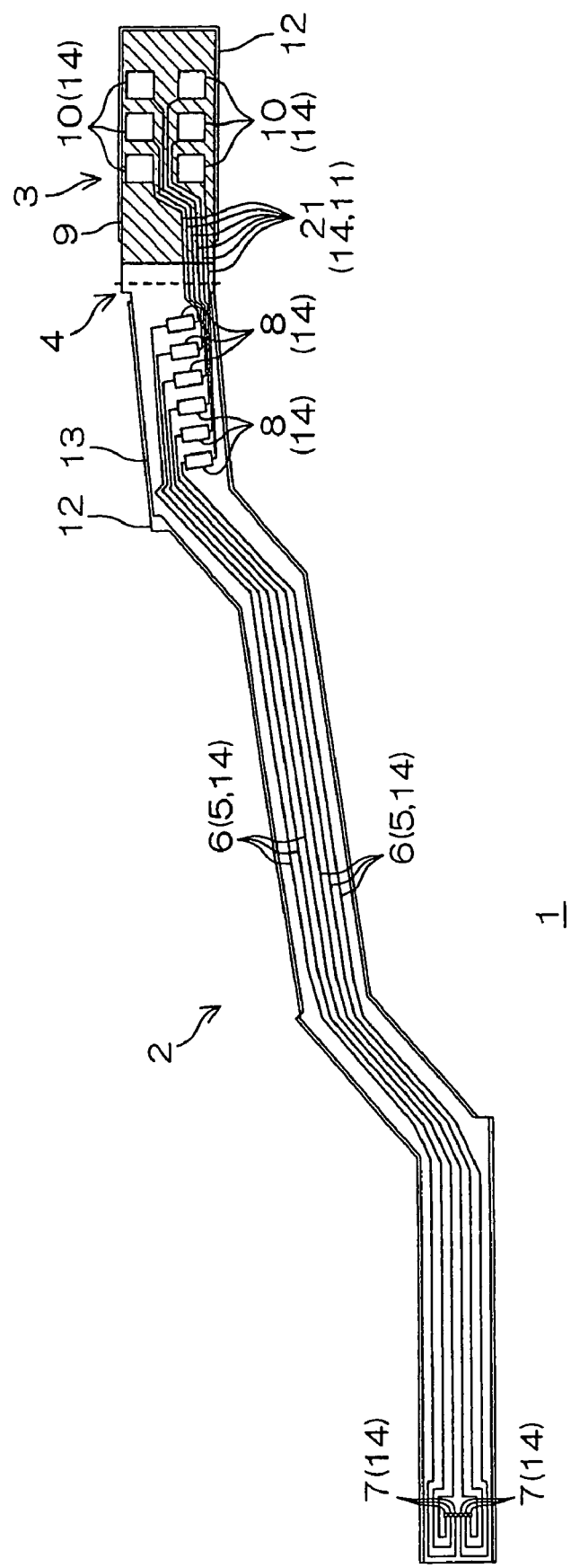

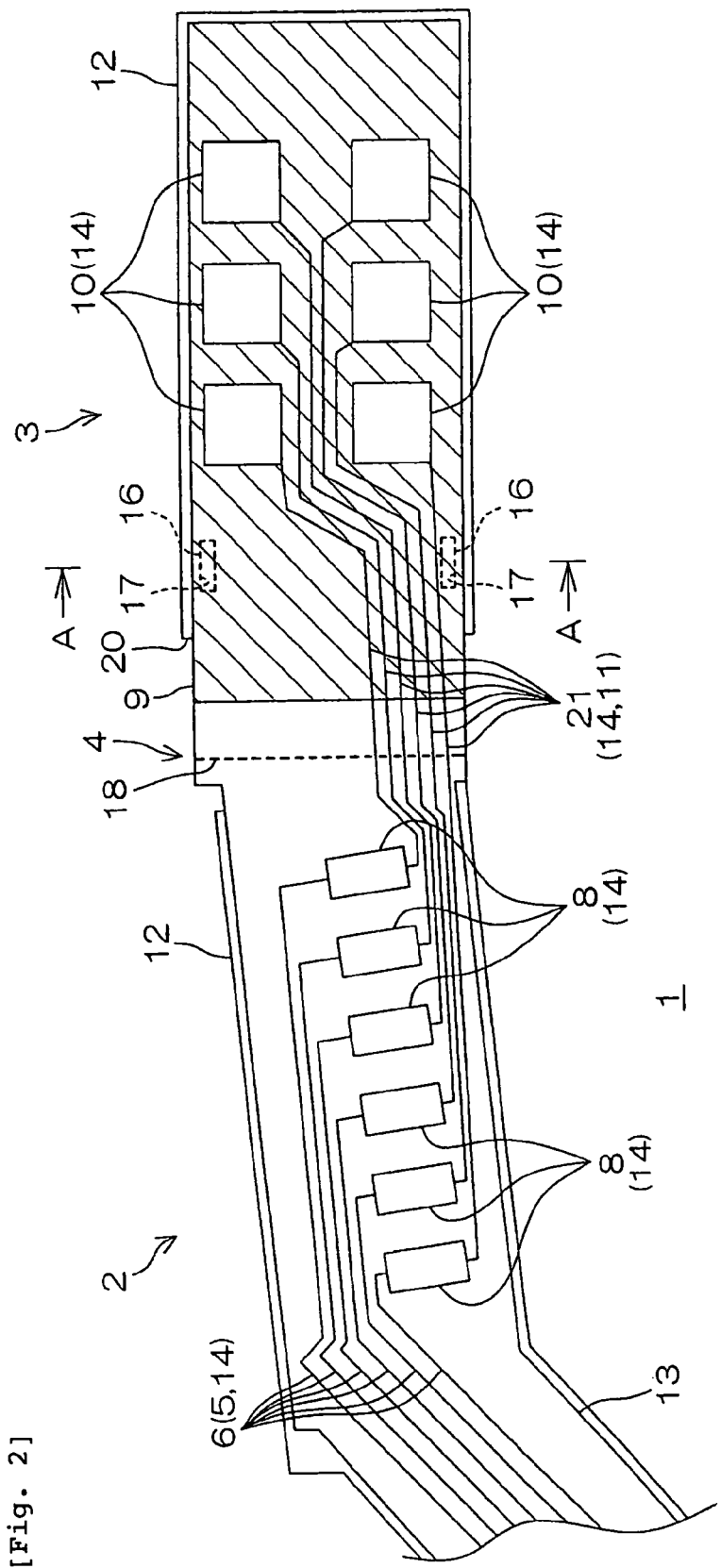

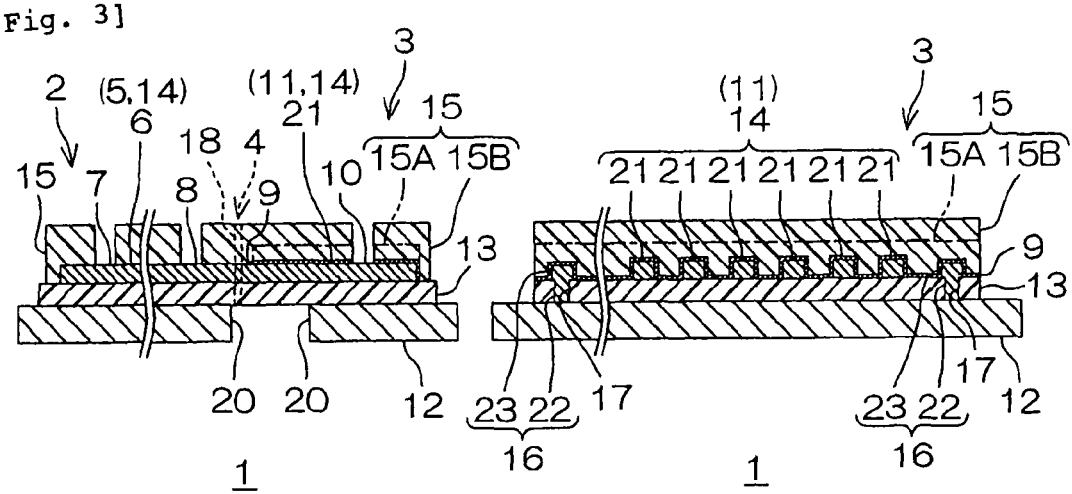
[Fig. 3]

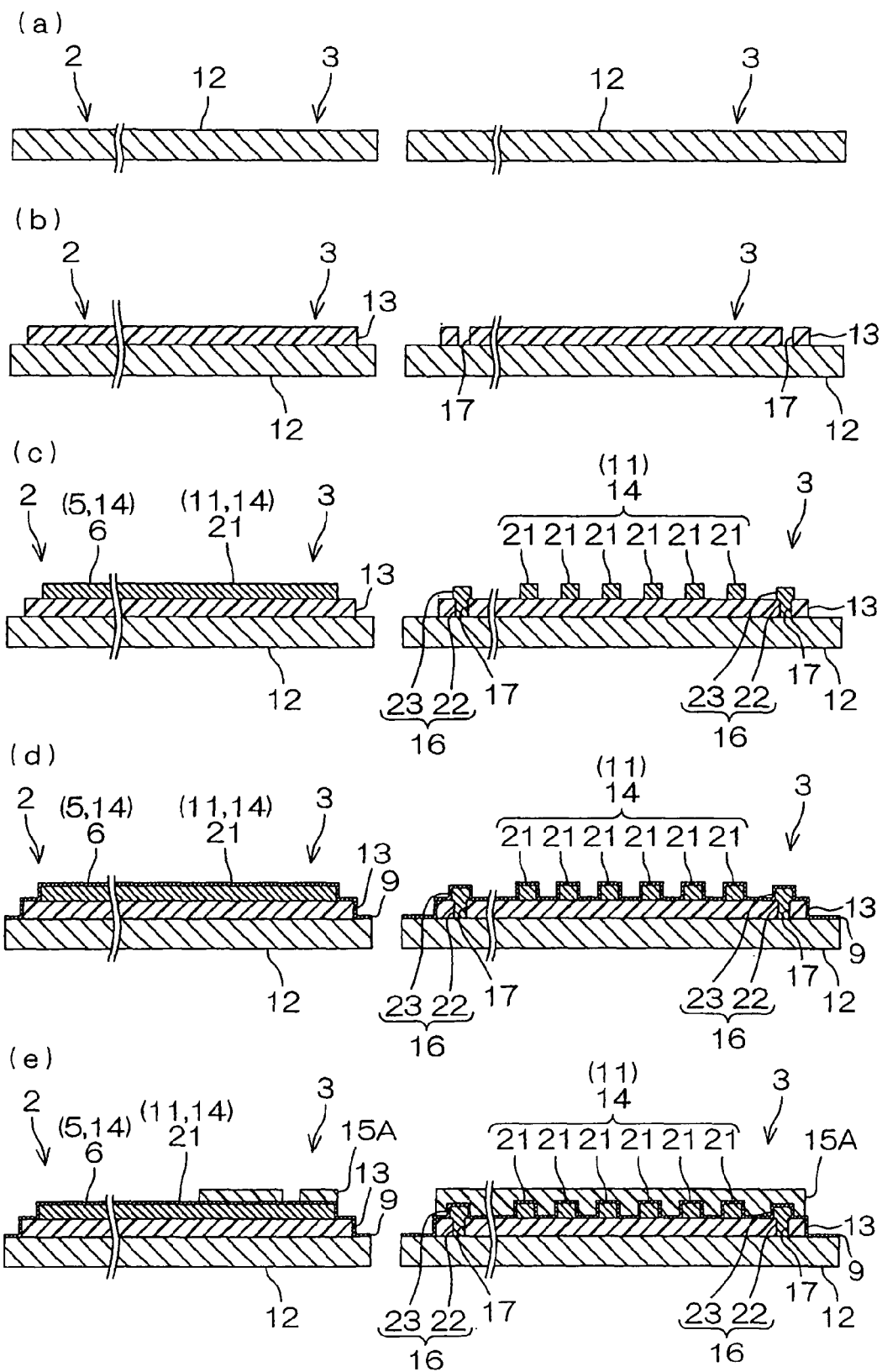
[Fig. 4]

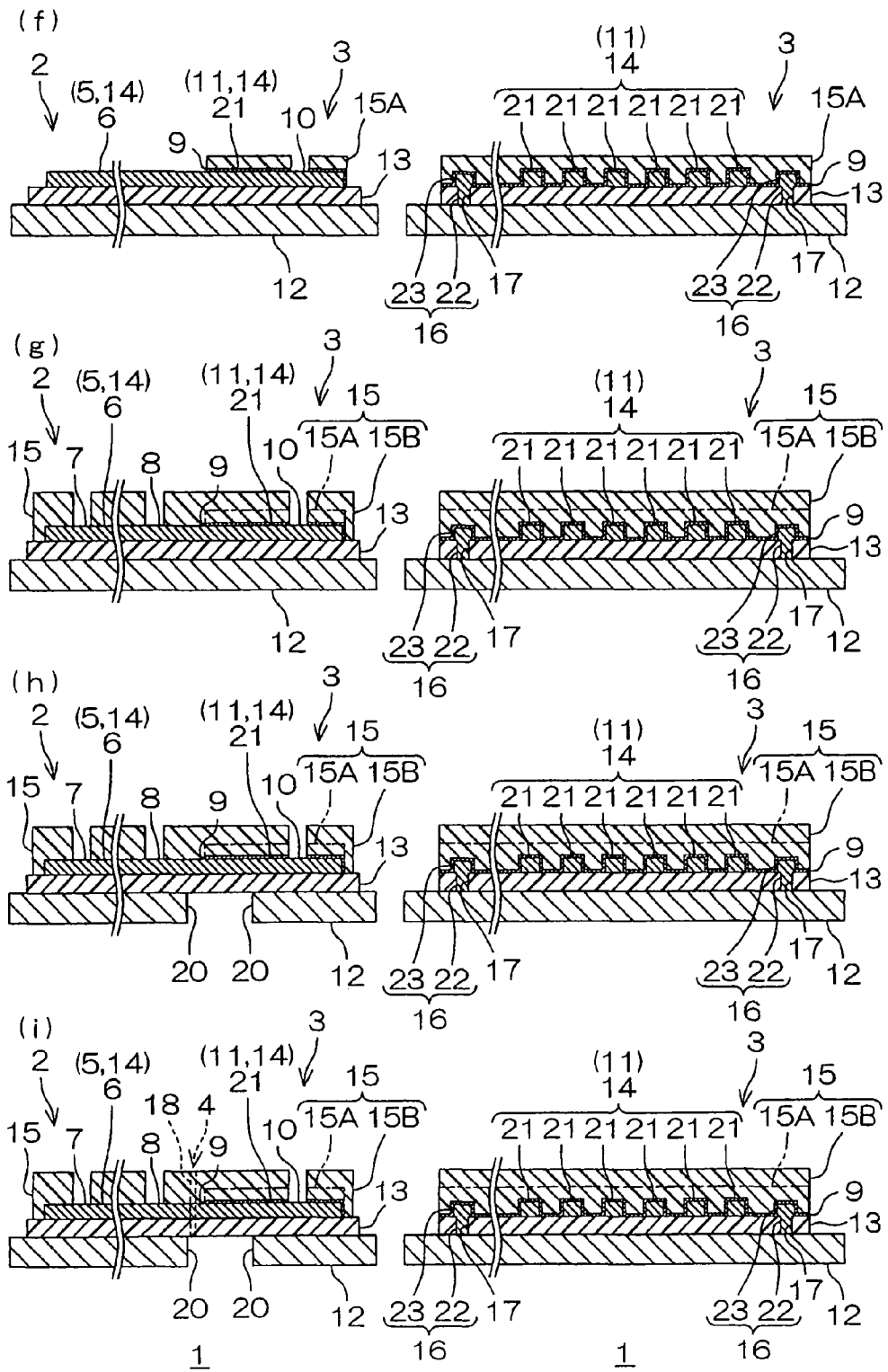
[Fig. 5]

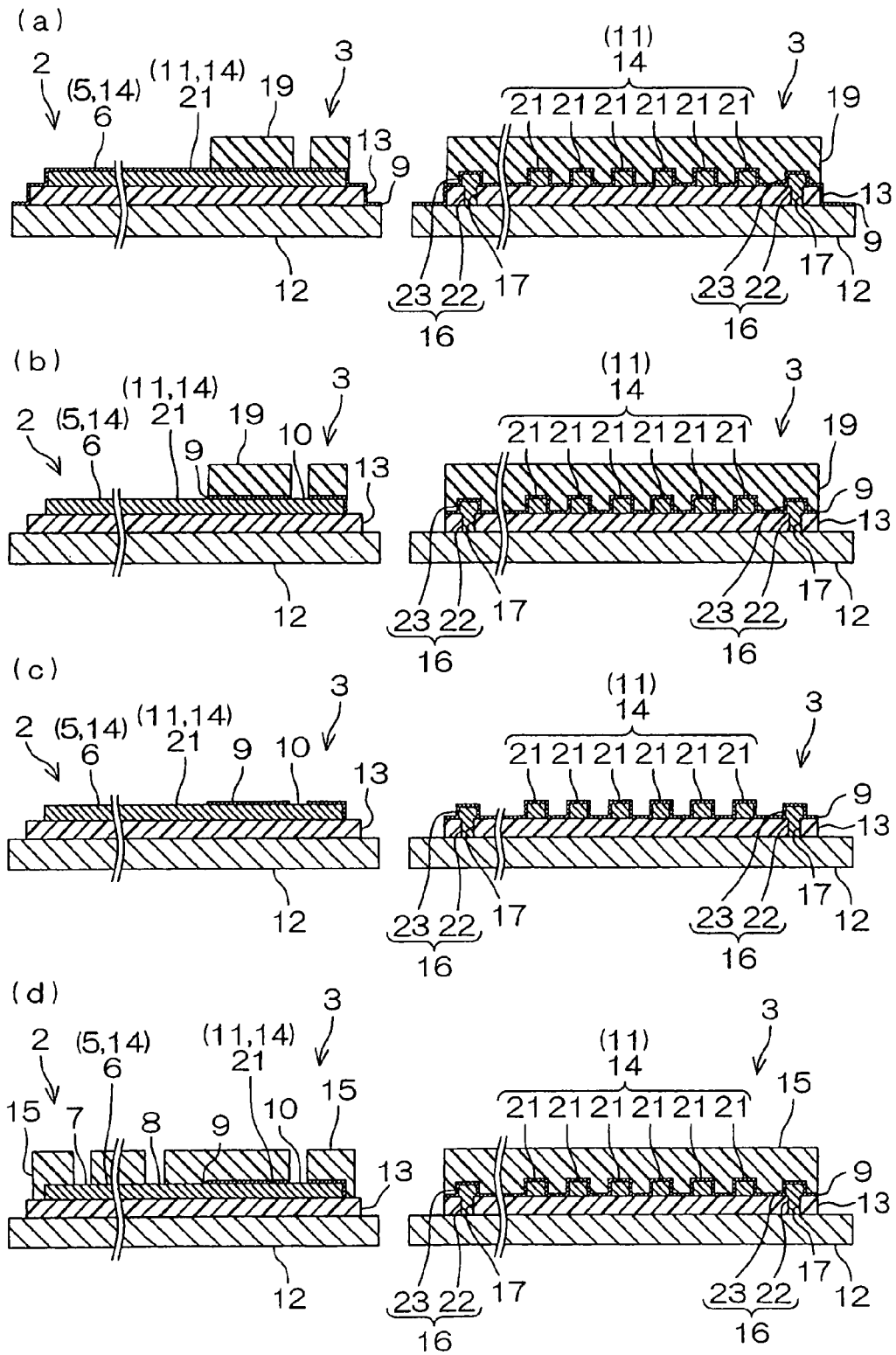
[Fig. 6]

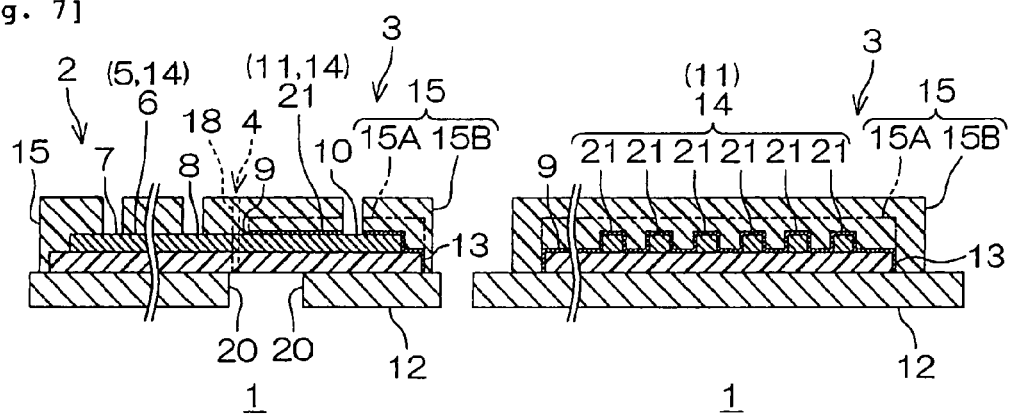
[Fig. 7]
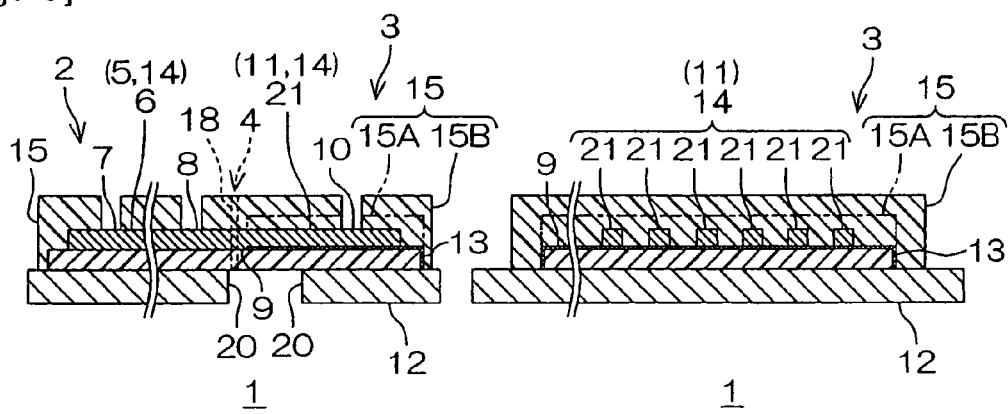
[Fig. 8]
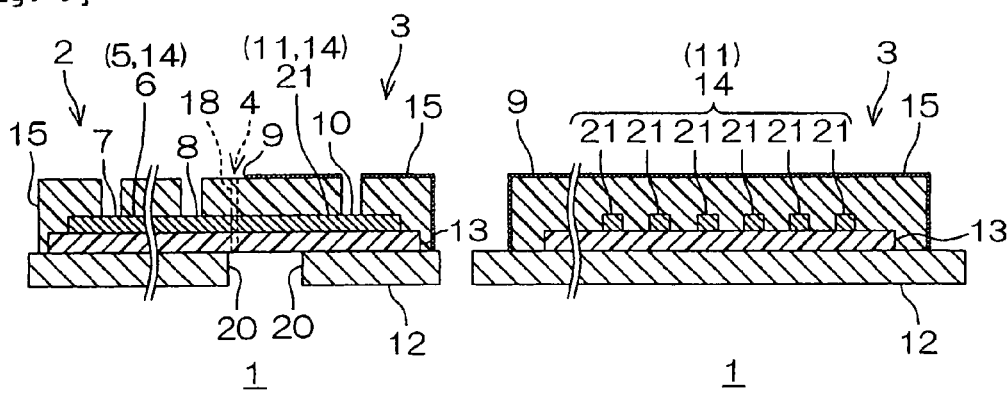
[Fig. 9]

[Fig. 10]
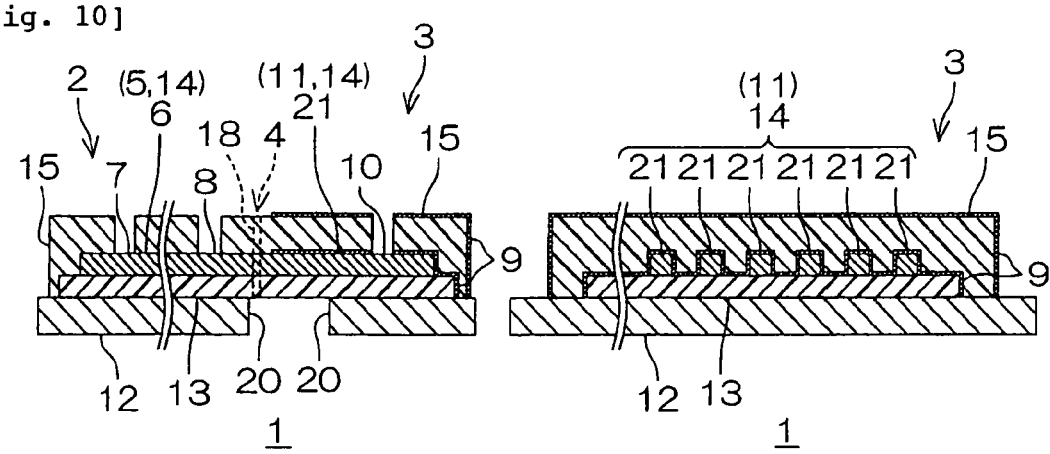

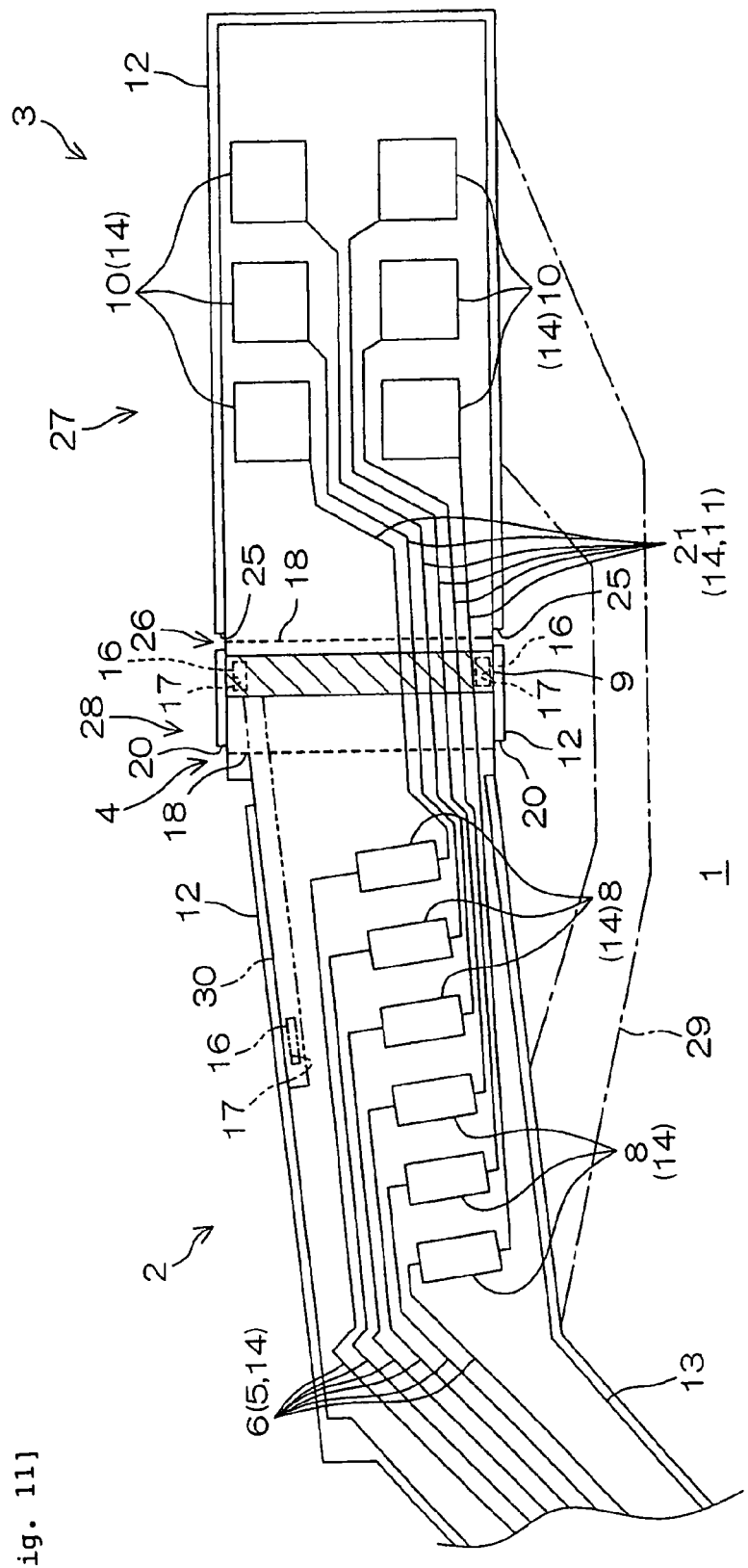
[Fig. 11]

[Fig. 12]
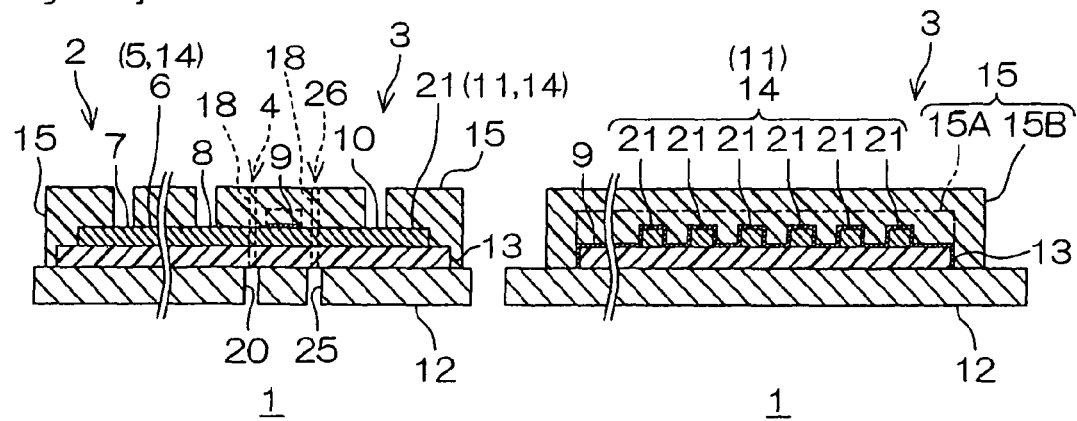
[Fig. 13]
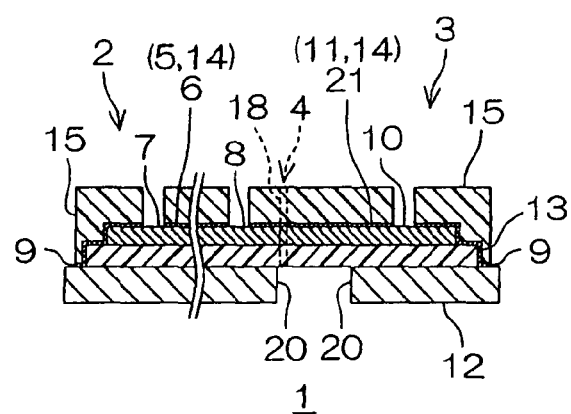

WIRED CIRCUIT BOARD

CROSS REFERENCE TO RELATED APPLICATION

This application claims the benefit of U.S. Provisional Application No. 60/847,095, filed Sep. 26, 2006, and claims priority from Japanese Patent Application No. 2006-213776, filed Aug. 4, 2006, the contents of which are herein incorporated by reference in their entirety.

BACKGROUND OF THE INVENTION

1. Field of the Invention

The present invention relates to a wired circuit board. More particularly, the present invention relates to a wired circuit board for mounting an electronic component, such as a suspension board with circuit.

2. Description of Related Art

A wired circuit board such as a suspension board with circuit includes, for example, a metal supporting board of stainless steel foil or the like, an insulating base layer of polyimide resin or the like, which is formed on the metal supporting board, a conductive pattern of copper foil or the like, which is formed on the insulating base layer, and an insulating cover layer of polyimide resin or the like, which is formed on the insulating base layer to cover the conductive pattern. The wired circuit boards of this type are widely used in a variety of fields of electric and electronic equipment.

In such wired circuit board, in order to prevent electronic components mounted thereon from electrostatic breakdown, there has been proposed that a semiconductor layer is formed by sequentially laminating a metal thin film and a metal oxide layer on surfaces of the insulating cover layer or insulating base layer of the suspension board with circuit, so that electrostatic charging can be removed via the semiconductor layer (cf., Japanese Unexamined Patent Publication No. 2004-335700).

In addition, there has been proposed that after a semiconductor layer is formed on a surface of an insulating layer, a through hole extending through the insulating layer and the semiconductor layer is formed so that a conductive layer may be exposed, and a connecting terminal is formed in the through hole to contact the semiconductor layer with the connecting terminal, thereby removing static electricity charged on the insulating layer and the conductive layer (cf., Japanese Unexamined Patent Publication No. 2003-152383).

SUMMARY OF THE INVENTION

Before an electronic component is mounted on a wired circuit board, electrostatic charging needs to be fully removed via a semiconductive layer to prevent the wired circuit board from electrostatic breakdown. In contrast to this, after an electronic component is mounted thereon, there is a possibility that the semiconductive layer may impair the electrical stability of the wired circuit board during energization.

In such view, in Japanese Unexamined Patent Publication No. 2004-335700 and Japanese Unexamined Patent Publication No. 2003-152383, the semiconductor layer is formed almost entirely on the suspension board with circuit, and thus continues to electrically affect the suspension board with circuit even after the electronic component is mounted thereon. As a result, there is a possibility that as described above, the semiconductor layer may impair the electrical stability and long term reliability of the suspension board with circuit during energization.

It is an object of the present invention to provide a wired circuit board capable of efficiently removing electrostatic charging before an electronic component is mounted thereon, and reliably securing electrical stability of a wired circuit body portion after the electronic component is mounted thereon.

The wired circuit board of the present invention includes a wired circuit body portion having a wired circuit, an electrostatic charge removing portion conducted with the wired circuit body portion and having a semiconductive layer, and a conduction cut-off portion arranged between the wired circuit body portion and the electrostatic charge removing portion to cut off electrical conduction therebetween.

According to this wired circuit board, before an electronic component is mounted on the wired circuit body portion, the static electricity charged on the wired circuit body portion can be efficiently removed via the semiconductive layer of the electrostatic charge removing portion that is conducted with the wired circuit body portion.

Besides, after an electronic component is mounted on the wired circuit body portion, electrical conduction between the wired circuit body portion and the electrostatic charge removing portion is cut off by the conduction cut-off portion, thereby allowing to prevent the wired circuit of the wired circuit body portion from being electrically affected by the semiconductive layer of the electrostatic charge removing portion. Accordingly, the electrical stability of the wired circuit body portion can be reliably secured.

In the wired circuit board of the present invention, it is preferable that the electrostatic charge removing portion is arranged adjacent to a peripheral end portion of the wired circuit body portion.

According to this wired circuit board, the electrostatic charge removing portion is arranged adjacent to the peripheral end portion of the wired circuit body portion. This allows easy arrangement of the conduction cut-off portion between the electrostatic charge removing portion and the wired circuit body portion. Accordingly, after mounting of electronic components, electrical conduction therebetween can be reliably cut off by the conduction cut-off portion.

In addition, since the electrostatic charge removing portion is arranged adjacent to the wired circuit body portion, the electrical conduction therebetween can be reliably secured before mounting of electronic components.

Further, since the electrostatic charge removing portion is arranged adjacent to the wired circuit body portion, the electrostatic charge removing portion and the wired circuit body portion can be formed integrally and continuously.

It is preferable that the wired circuit board of the present invention includes a first terminal portion connected to the wired circuit and arranged on one side of the wired circuit body portion, and a second terminal portion connected to the wired circuit and arranged on the other side of the wired circuit body portion. It is preferable that the electrostatic charge removing portion is arranged on an outer side of a direction along the wired circuit with respect to the wired circuit between the first terminal portion and the second terminal portion.

According to this wired circuit board; since the electrostatic charge removing portion is arranged on the outer side of the direction along the wired circuit with respect to the wired circuit between the first terminal portion and the second terminal portion, the conduction cut-off portion is used to remove electrical conduction between the electrostatic charge removing portion arranged on the outer side thereof, and the wired circuit body portion. This allows to reliably prevent the semiconductive layer from electrically affecting the first terminal portion and the second terminal portion, and the wired circuit therebetween.

In the wired circuit board of the present invention, it is preferable that the electrostatic charge removing portion is separable from the wired circuit body portion at the conduction cut-off portion as a boundary.

According to this wired circuit board, since the electrostatic charge removing portion can be separated from the wired circuit body portion using the conduction cut-off portion as a boundary, the electrical conduction between the wired circuit body portion and the electrostatic charge removing portion can be more reliably cut off by the conduction cut-off portion.

In the wired circuit board of the present invention, it is preferable that a notch is formed in the conduction cut-off portion.

According to this wired circuit board, since the wired circuit body portion and the electrostatic charge removing portion can be divided along the notch, the wired circuit body portion and the electrostatic charge removing portion can be easily separated by the conduction cut-off portion, thereby allowing to easily cut off the electrical conduction therebetween.

In the wired circuit board of the present invention, it is preferable that the electrostatic charge removing portion includes a conductive layer connected to the wired circuit and an insulating layer laminated on the conductive layer, and the semiconductive layer is formed on the conductive layer and/or the insulating layer.

According to this wired circuit board, since the semiconductive layer is formed on the conductive layer and/or the insulating layer, static electricity charged on the conductive layer and/or the insulating layer can be efficiently removed via the semiconductive layer.

In the wired circuit board of the present invention, it is preferable that the electrostatic charge removing portion further includes a metal supporting layer, and the semiconductive layer is electrically connected with the metal supporting layer.

According to this wired circuit board, since the semiconductive layer is electrically connected with the metal supporting layer, static electricity charged on the wired circuit body portion can be efficiently removed from the semiconductive layer to the metal supporting layer.

In the wired circuit board of the present invention, it is preferable that the electrostatic charge removing portion includes a third terminal portion connected to the conductive layer.

According to this wired circuit board, since the third terminal portion is connected to the conductive layer and the conductive layer is then connected to the wired circuit, the third terminal portion can be used to perform a continuity test on the wired circuit.

In the wired circuit board of the present invention, it is preferable that the electrostatic charge removing portion includes a third terminal portion forming portion having the third terminal portion formed thereon, a semiconductive layer forming portion arranged between the third terminal portion forming portion and the conduction cut-off portion to form the semiconductive layer thereon, and an auxiliary conduction cut-off portion arranged between the third terminal portion forming portion and the semiconductive layer forming portion to cut off the electrical conduction therebetween.

According to this wired circuit board, before mounting of electronic components, static electricity charged on the wired circuit body portion can be efficiently removed via the semiconductive layer of the electrostatic charge removing portion that is conducted with the wired circuit body portion.

In addition, before mounting of electronic components, the third terminal portion of the third terminal portion forming portion is used to perform a continuity test on the wired circuit, and thereafter, the auxiliary conduction cut-off portion can be used to cut off the electrical conduction between the third terminal portion forming portion and the semiconductive layer forming portion. Subsequently, even after the cut-off by the auxiliary conduction cut-off portion, a semiconductive layer is formed in the semiconductive layer forming portion, so that the static electricity charged on the wired circuit body portion can be efficiently removed via the semiconductive layer.

After an electronic component is mounted on the wired circuit body portion, electrical conduction between the wired circuit body portion and the semiconductive layer forming portion is already cut off by the conduction cut-off portion, so that it is possible to prevent the wired circuit of the wired circuit body portion from being electrically affected by the semiconductive layer of the semiconductive layer forming portion. Accordingly, the electrical stability of the wired circuit body portion can be reliably secured.

In the wired circuit board of the present invention, it is preferable that the third terminal portion forming portion is separable from the semiconductive layer forming portion at the auxiliary conduction cut-off portion as a boundary.

According to this wired circuit board, since the third terminal portion forming portion can be separated from the semiconductive layer forming portion using the auxiliary conduction cut-off portion as a boundary, electrical conduction between the third terminal portion forming portion and the semiconductive layer forming portion can be more reliably cut off by the auxiliary conduction cut-off portion.

In the wired circuit board of the present invention, it is preferable that a notch is formed in the auxiliary conduction cut-off portion.

According to this wired circuit board, the third terminal portion forming portion and the semiconductive layer forming portion can be divided along the notch, so that the third terminal portion forming portion and the semiconductive layer forming portion can be easily separated by the auxiliary conduction cut-off portion, thereby allowing to easily cut off electrical conduction therebetween.

According to this wired circuit board, before an electronic component is mounted on the wired circuit body portion, static electricity charged thereon can be efficiently removed via the semiconductive layer of the electrostatic charge removing portion that is conducted with the wired circuit body portion.

BRIEF DESCRIPTION OF THE DRAWINGS

FIG. 1 is a schematic plan view illustrating a suspension board with circuit as an embodiment of a wired circuit board according to the present invention;

FIG. 2 is an enlarged plan view of an electrostatic charge removing portion of the suspension board with circuit shown in FIG. 1;

FIG. 3 is a sectional view of the suspension board with circuit shown in FIGS. 1 and 2, in which the left-side figure is a sectional view thereof in a direction along the longitudinal direction of a conductive pattern, and the right-side figure is a sectional view of an electrostatic charge removing portion in a direction along the widthwise direction of the suspension board with circuit, taken along the line A-A in FIG. 2;

FIG. 4 is a sectional view illustrating the steps of producing a suspension board with circuit shown in FIG. 3, (a) showing the step of preparing a metal supporting layer, (b) showing the step of forming an insulating base layer on the metal supporting layer to provide a pattern in which a base opening is formed, (c) showing the step of simultaneously forming a conductive pattern and a ground connecting portion, (d) showing the step of forming a semiconductive layer so as to be continuous with all of the surface of a conductive pattern, the surface of an upper part of the ground connecting portion, the surface of the insulating base layer, and the surface of the metal supporting layer, and (e) showing the step of forming a first insulating cover layer on the semiconductive layer of an electrostatic'charge removing portion (except for a front end portion thereof) in a pattern;

FIG. 5 is a sectional view illustrating the steps, subsequent to FIG. 4, of producing the suspension board with circuit shown in FIG. 3, (f) showing the step of removing the semiconductive layer exposed from the first insulating cover layer, (g) showing the step of forming a second insulating cover layer on the insulating base layer in a pattern so as to cover the first insulating cover layer and the conductive pattern, (h) showing the step of forming a metal opening in the metal supporting layer and (i) showing the step of forming a notch in a conduction cut-off portion;

FIG. 6 is a sectional view illustrating another process of producing a suspension board with circuit shown in FIGS. 4 and 5, (a) showing the step of forming an etching resist on a semiconductive layer of an electrostatic charge removing portion (except for a front end portion thereof) in a pattern, (b) showing the step of removing the semiconductive layer exposed from the etching resist, (c) showing the step of removing the etching resist; and (d) showing the step of forming an insulating cover layer on an insulating base layer in a pattern so as to cover the semiconductive layer and a conductive pattern;

FIG. 7 is a sectional view corresponding to FIG. 3, showing a suspension board with circuit as another embodiment (an embodiment in which a semiconductive layer directly contacts a metal supporting layer, and the semiconductive layer is interposed between an auxiliary wired circuit and an insulating cover layer) of a wired circuit board according to the present invention;

FIG. 8 is a sectional view corresponding to FIG. 3, showing a suspension board with circuit as another embodiment (an embodiment in which a semiconductive layer directly contacts a metal supporting layer, and the semiconductive layer is interposed between an auxiliary wired circuit and an insulating base layer) of a wired circuit board according to the present invention;

FIG. 9 is a sectional view corresponding to FIG. 3, showing a suspension board with circuit as another embodiment (an embodiment in which a semiconductive layer directly contacts a metal supporting layer, and the semiconductive layer is formed on the surface of an insulating cover layer) of a wired circuit board according to the present invention;

FIG. 10 is a sectional view corresponding to FIG. 3, showing a suspension board with circuit as another embodiment (an embodiment in which a semiconductive layer directly contacts a metal supporting layer, and the semiconductive layer is formed on the surface of an insulating base layer and the surface of an auxiliary wiring circuit, and also formed on the surface of an insulating cover layer) of a wired circuit board according to the present invention;

FIG. 11 is an enlarged plan view corresponding to FIG. 2, showing an electrostatic charge removing portion in a suspension board with circuit as another embodiment (an embodiment in which two conduction cut-off portions are formed) of a wired circuit board according to the present invention;

FIG. 12 is a sectional view corresponding to FIG. 3, showing a suspension board with circuit shown in FIG. 11, in which the left-side figure is a sectional view in a direction along a conductive pattern, and the right-side figure is a sectional view of a semiconductive layer forming portion in a direction along the widthwise direction of the suspension board with circuit; and FIG. 13 is a sectional view corresponding to the left-side figure of FIG. 3, showing a suspension board with circuit in a direction along a conductive pattern.

DETAILED DESCRIPTION OF THE INVENTION

FIG. 1 is a schematic plan view illustrating a suspension board with circuit as an embodiment of a wired circuit board according to the present invention, FIG. 2 is an enlarged plan view of an electrostatic charge removing portion of the suspension board with circuit shown in FIG. 1, FIG. 3 is a sectional view of the suspension board with circuit shown in FIGS. 1 and 2, in which the left-side figure is a sectional view thereof in a direction along the longitudinal direction (hereinafter simply referred to as "lengthwise direction", corresponding to the direction along a main wired circuit mentioned later) of a conductive pattern (mentioned later), and the right-side figure is a sectional view of an electrostatic charge removing portion in a direction orthogonal to the lengthwise direction of the suspension board with circuit (hereinafter simply referred to as "widthwise direction"), taken along the line A-A in FIG. 2. To clarify a relative position of a conductive pattern 14 to a metal supporting layer 12, an insulating cover layer 15, which is mentioned later, is omitted in FIGS. 1 and 2.

In FIG. 1, the suspension board with circuit 1 is mounted with an electronic component, such as a magnetic head (not shown) and a read/write board (not shown), and then mounted on a hard disk drive. The suspension board with circuit 1 is formed in a shape of a flat band extending in the lengthwise direction, including a wired circuit body portion 2, an electrostatic charge removing portion 3, and a conduction cut-off portion 4 arranged between the wired circuit body portion 2 and the electrostatic charge removing portion 3.

The wired circuit body portion 2 is arranged on the front end side in the lengthwise direction of the suspension board with circuit 1, and integrally includes a main wired circuit 5 serving as a wired circuit, a magnetic-head-side connecting terminal portion 7 serving as a first terminal portion, and an external connecting terminal portion 8 serving as a second terminal portion.

The main wired circuit 5 has a plurality (six pieces) of main wirings 6, each provided over the lengthwise direction of the wired circuit body portion 2, and arranged in parallel at spaced intervals with respect to the widthwise direction so as to be opposed to one another.

A plurality (six pieces) of the magnetic-head-side connecting terminal portions 7 are arranged at a front end portion of the wired circuit body portion 2 in parallel along the widthwise direction as a broad land with an angle. Front end portions of the main wirings 6 are connected to the magnetic-head-side connecting terminal portions 7 respectively.

Terminal portions (not shown) of the magnetic head are connected of the magnetic-head-side connecting terminal portions 7 after production of the suspension board with circuit 1.

A plurality (six pieces) of the external connecting terminal portions 8 are arranged at a rear end portion of the wired circuit body portion 2 in parallel along the lengthwise direction as a broad land with an angle. Rear end portions of the main wirings 6 are connected to the external connecting terminal portions 8 respectively. Terminal portions (not shown) of the read/write board are connected to the external connecting terminal portions 8 after production of the suspension board with circuit 1.

The electrostatic charge removing portion 3 is arranged adjacent to the rear end portion of the wired circuit body portion 2 so as to be continuous with the wired circuit body portion 2, and arranged on the outer side of the lengthwise direction with respect to the main wired circuit 5 between the magnetic-head-side connecting terminal portion 7 and the external connecting terminal portion 8 in the wired circuit body portion 2, that is, adjacent to the rear side of the rear end portion of the wired circuit body portion 2 (on the right side in FIG. 1).

As shown in FIG. 2, the electrostatic charge removing portion 3 integrally includes an auxiliary wired circuit 11 serving as a conductive layer, and an test-side connecting terminal portion 10 serving as a third terminal portion.

The auxiliary wired circuit 11 has a plurality (six pieces) of auxiliary wirings 21, each provided over the lengthwise direction of the electrostatic charge removing portion 3, and arranged in parallel at spaced intervals with respect to the widthwise direction so as to be opposed to one another. The auxiliary wirings 21 on the front side of the auxiliary wired circuit 11 are also arranged in the wired circuit body portion 2, traversing over the conduction cut-off portion 4 to be connected with the external connecting terminal portions 8 of the wired circuit body portion 2 respectively. In this connection, the auxiliary wired circuit 11 is connected with the main wired circuit 5 through the external connecting terminal portions 8.

A plurality (six pieces) of the test-side connecting terminal portions 10 are arranged in line on the rear end side of the electrostatic charge removing portion 3 along the lengthwise direction and the widthwise direction as a broad land with an angle. Rear end portions of the auxiliary wirings 21 are connected to the test-side connecting terminal portions respectively. Accordingly, the test-side connecting terminal portions 10 are connected with the main wired circuit 5 through the auxiliary wirings 21 and the external connecting terminal portions 8.

A continuity test probe, which is mentioned later, is connected to the test-side connecting terminal portion 10 during a continuity test after production of the suspension board with circuit 1.

The conduction cut-off portion 4 is linearly arranged along the widthwise direction between the wired circuit body portion 2 and the electrostatic charge removing portion 3, and it is possible to separate the electrostatic charge removing portion 3 from the wired circuit body portion 2 using the conduction cut-off portion 4 as a boundary. More specifically, the conduction cut-off portion 4 has perforated notches 18 formed by intermittently removing the insulating base layer 13 (mentioned later) and the insulating cover layer 15 (mentioned later) over the widthwise direction.

The notch 18 in the conduction cut-off portion 4 has a width (length in lengthwise direction) in the range of, for example, 40 to 100 μm, or preferably 40 to 80 μm, and a length (length in widthwise direction) in the range of, for example, 60 to 1000 μm, or preferably 80 to 240 μm. In addition, a widthwise spacing between each of the notches 18 is in the range of, for example, 40 to 960 μm, or preferably 80 to 120 μm.

As shown in FIG. 3, the suspension board with circuit 1 includes a metal supporting layer 12, an insulating base layer 13 serving as an insulating layer formed (laminated) on the metal supporting layer 12, a conductive pattern 14 formed (laminated) on the insulating base layer 13, a ground connecting portion 16 formed (laminated) on the metal supporting layer 12, a semiconductive layer 9 formed (laminated) on the insulating base layer 13 so as to cover the conductive pattern 14 and the ground connecting portion 16, and an insulating cover layer 15 serving as an insulating layer formed (laminated) on the insulating base layer 13 so as to cover the conductive pattern 14 and the semiconductive layer 9.

The metal supporting layer 12 is formed of a flat thin plate extending in the lengthwise direction that corresponds to the outer shape of the suspension board with circuit 1 described above as shown in FIG. 1. In addition, as shown in FIGS. 2 and 3, a metal opening 20 is formed in the metal supporting layer 12 so as to expose each backside of the insulating base layer 13 in the conduction cut-off portion 4, and in the wired circuit body portion 2 and the electrostatic charge removing portion 3 both of which are continuous with the conduction cut-off portion 4. The metal opening 20 is opened in the metal supporting layer 12 over the widthwise direction so that the metal supporting layer 12 may be divided in the lengthwise direction into a side of the wired circuit body portion 2 and a side of the electrostatic charge removing portion 3.

The length (length in lengthwise direction; the same applies hereinafter) and width (length in widthwise direction; the same applies hereinafter) of the metal supporting layer 12 are appropriately selected depending on the purpose and application.

The insulating base layer 13 is formed on the metal supporting layer 12 corresponding to a portion where the conductive pattern 14 is formed in a pattern to expose a portion where the ground connecting portion 16 is formed and a peripheral end portion of the metal supporting layer 12. Further, the perforated notches 18 are formed over the widthwise direction in the insulating base layer 13 of the conduction cut-off portion 4.

As shown in FIG. 2, in order to form the ground connecting portion 16, two base openings 17 are formed in the insulating base layer 13 at positions located on the front end side of the electrostatic charge removing portion 3 but on the rear end side from the metal opening 20 in the electrostatic charge removing portion 3 and on the front end side from the test-side connecting terminal portion 10, in both widthwise end portions of the electrostatic charge removing portion 3.

Each of the base openings 17 is arranged at spaced intervals outward in the widthwise direction from an outermost auxiliary wiring 21 of the auxiliary wired circuit 11, and is formed so as to extend through the insulating base layer 13 in the thickness direction. Each of the base openings 17 is opened in a generally rectangular shape in plane view, extending in the lengthwise direction.

The length and width of the insulating base layer 13 are appropriately selected depending on the purpose and application so that the above-mentioned shape may be obtained.

As shown in FIGS. 1 and 3, the conductive pattern is formed on the insulating base layer 13 in the above-mentioned pattern which integrally includes the magnetic-head-side connecting terminal portion 7, the external connecting terminal portion 8, the test-side connecting terminal portion 10, the main wired circuit 5, and the auxiliary wired circuit 11.

The main wired circuit 5 is provided on the wired circuit body portion 2 as described above, connected to the magnetic-head-side connecting terminal portion 7 and the external connecting terminal portion 8, and has the plurality of main wirings 6.

The auxiliary wired circuit 11 is provided over the electrostatic charge removing portion 3 and the rear end portion of the wired circuit body portion 2 as described above, connected to the test-side connecting terminal portion 10 and the external connecting terminal portion 8, and has the plurality of auxiliary wirings 21.

The auxiliary wired circuit 11 is arranged on the insulating base layer 13 of the electrostatic charge removing portion 3 to secure a region for forming the base openings 17.

The width of each of the main wirings 6 (width in parallel direction of each of the main wirings 6; the same applies to the following) and the width of each of the auxiliary wirings 21 are individually in the range of, for example, 10 to 100 μm, or preferably 15 to 50 μm. A spacing between each of the main wirings 6 (spacing in parallel direction of each of the main wirings 6; the same applies to the following) and a spacing between each of the auxiliary wirings 21 are individually in the range of, for example, 15 to 985 μm, or preferably 30 to 100 μm.

The width of the magnetic-head-side connecting terminal portion 7 (length in parallel direction of each of the magnetic-head-side connecting terminal portions 7; the same applies to the following), the width of the external connecting terminal portion 8 (length in parallel direction of each of the external connecting terminal portions 8; the same applies to the following), and the width of the test-side connecting terminal portion 10 (length in lengthwise and widthwise directions of the test-side connecting terminal portion 10; the same applies to the following) are individually in the range of, for example, 20 to 1000 μm, or preferably 30 to 800 μm. A spacing between the magnetic-head-side connecting terminal portions 7 (spacing in parallel direction of each of the magnetic-head-side connecting terminal portions 7; the same applies to the following), a spacing between the external connecting terminal portions 8 (spacing in parallel direction of each of the external connecting terminal portions 8; the same applies to the following), and a spacing between the test-side connecting terminal portions 10 (spacing in lengthwise and widthwise directions of each of the test-side connecting terminal portions 10; the same applies to the following) are individually in the range of, for example, 20 to 1000 μm, or preferably 30 to 800 μm.

As shown in the right-side figure of FIG. 3, the ground connecting portion 16 integrally and continuously includes a lower portion 22 formed so as to fill in the base openings 17 of the insulating base layer 13 described above, and an upper portion 23 formed so as to expand from the upper end of the lower portion 22 upward in a thickness direction of the insulating base layer 13 and toward both sides of a lengthwise direction (not shown) and of a widthwise direction, so as to cover the surface of the insulating base layer 13 around the base opening 17.

In the ground connecting portion 16, the underside of the lower portion 22 is in contact with the metal supporting layer 12.

The lower portion 22 of the ground connecting portion 16 has a width in the range of, for example, 40 to 2000 μm, or preferably 60 to 500 μm. The upper portion 23 thereof has a width in the range of, for example, 70 to 2060 μm, or preferably 90 to 560 μm. The lengths of the lower portion 22 and the upper portion 23 of the ground connecting portion 16 are appropriately selected depending on the purpose, application, and product design.

As shown in FIGS. 2 and 3, the semiconductive layer 9 is provided only in the electrostatic charge removing portion 3. More specifically, the semiconductive layer 9 is arranged entirely on the insulating base layer 13 of the electrostatic charge removing portion 3 except for a front end portion thereof, and is formed in a generally rectangular shape in plane view.

Even more specifically, as shown in FIG. 3, the semiconductive layer 9 is continuously formed in the electrostatic charge removing portion 3 so as to cover the auxiliary wired circuit 11 and the ground connecting portion 16 on the insulating base layer 13 covered with the first insulating cover layer 15A shown in phantom line, and so as to expose the test-side connecting terminal portion 10. That is, the semiconductive layer 9 is formed so as to be interposed between the insulating cover layer 15 (first insulating cover layer 15A) and, the insulating base layer 13, the auxiliary wired circuit 11 and the ground connecting portion 16.

Thus, in the electrostatic charge removing portion 3, the semiconductive layer 9 contacts the insulating base layer 13, the auxiliary wired circuit 11, and the ground connecting portion 16 on the lower side in the thickness direction, and contacts the insulating cover layer 15 on the upper side in the thickness direction.

The semiconductive layer 9 also contacts the upper portion 23 of the ground connecting portion 16, and is electrically connected with the metal supporting layer 12 via the ground connecting portion 16.

The insulating cover layer 15 is formed on the insulating base layer 13 so as to cover the conductive pattern 14 and the semiconductive layer 9. More specifically, the insulating cover layer 15 is formed on the insulating base layer 13 so as to cover the semiconductive layer 9 in the electrostatic charge removing portion 3 (except for the front end portion thereof), and so as to cover the conductive pattern 14 in the wired circuit body portion 2 (and in the front end portion of the electrostatic charge removing portion 3).

In the conduction cut-off portion 4, a notch 18 having the same perforation in plane view as the notch 18 formed in the insulating base layer 13 is formed in the insulating cover layer 15.

As shown in the left-side figure of FIG. 3, the insulating cover layer 15 has an opening in a portion corresponding to the magnetic-head-side connecting terminal portion 7, the external connecting terminal portion 8, and the test-side connecting terminal portion 10 so as to expose these terminal portions.

The length and width of the insulating cover layer 15 are appropriately selected depending on the purpose and application so that the above-mentioned shape may be obtained.

In a process of producing the suspension board with circuit 1, which is mentioned later (cf. FIG. 5(f)), when the first insulating cover layer 15A is used as an etching resist, the insulating cover layer 15 is formed from the first insulating cover layer 15A and the second insulating cover layer 15B.

FIGS. 4 and 5 are sectional views illustrating a process of producing a suspension board with circuit shown in FIG. 3.

Next, a method of producing the suspension board with circuit 1 is described with reference to FIGS. 4 and 5.

In this method, a metal supporting layer 12 is first prepared, as shown in FIG. 4(a).

A metal foil, such as a stainless steel, a 42-alloy, an aluminum foil, a copper foil, a copper-beryllium foil, or a phosphor bronze foil, is used for the metal supporting layer 12, for example. Preferably, a stainless steel foil is used. The metal supporting layer 12 has a thickness in the range of, for example, 10 to 51 μm, or preferably 15 to 30 μm.

Then, in this method, as shown in FIG. 4(b), the insulating base layer 13 is formed on the metal supporting layer 12 to correspond to a portion where the conductive pattern 14 is formed, and to provide the above-mentioned pattern in which the base openings 17 are formed.

The insulating base layer 13 is formed of resin, for example, polyimide resin, polyamide imide resin, acrylic resin, polyether nitrile resin, polyether sulfone resin, polyethylene terephthalate resin, polyethylene naphthalate resin, polyvinyl chloride resin, etc. Of these resins, polyimide resin is preferably used in terms of heat resistance.

The method for forming the insulating base layer 13 in the above-mentioned pattern is not particularly limited and a known method is used. For example, a varnish of photosensitive resin (photosensitive polyamic acid resin) is coated over a surface of the metal supporting layer 12, and the coated varnish is dried to form a base coating. Subsequently, the base coating is exposed to light via a photomask, and then heated as required and developed to form the above-mentioned pattern. Then, for example, the pattern is heated at 250° C. or higher under reduced pressure to be cured (imidized).

The insulating base layer 13 thus formed has a thickness in the range of, for example, 1 to 35 μm, or preferably 8 to 15 μm.

Then, in this method, as shown in FIG. 4(c), the conductive pattern 14 is formed on the insulating base layer 13 in the above-mentioned pattern (pattern of the main wired circuit 5 and the auxiliary wired circuit 11), and at the same time, each of the ground connecting portions 16 is formed on the metal supporting layer 12 exposed from each of the base openings 17 in the insulating base layer 13 so that the lower portion 22 thereof fills each of the base openings 17 in the insulating base layer 13, and so that the upper portion 23 thereof covers the circumference of each of the base openings 17 in the insulating base layer 13.

Both the conductive pattern 14 and the ground connecting portion 16 are formed of the same conductive material, for example, copper, nickel, gold, solder, or alloys thereof, or preferably copper is used. The conductive pattern 14 and the ground connecting portion 16 are formed on the upper surfaces of the insulating base layer 13 and metal supporting board 12 (including the portion exposed from each of the base openings 17 in the insulating base layer 13) in the above-mentioned pattern by a known patterning method, such as an additive method or a subtractive method, or preferably, the additive method.

In the additive method, a thin conductive film (seed layer) is first formed on the surfaces of the insulating base layer 13 and the metal supporting layer 12. To form the thin conductive film, a thin chromium film and a thin copper film are sequentially laminated by sputtering, or preferably chromium sputtering and copper sputtering.

Then, after a plating resist is formed in a pattern reverse to the conductive pattern 14 and the ground connecting portion 16 on the upper surface of the thin conductive film, the conductive pattern 14 and the ground connecting portion 16 are simultaneously formed on the upper surface of the thin conductive film exposed from the plating resist by electrolytic plating. Thereafter, the plating resist and the thin conductive film on which the plating resist is laminated are removed.

The conductive pattern 14 thus formed has a thickness in the range of, for example, 3 to 20 μm, or preferably 5 to 20 μmm. The upper portion 23 of the ground connecting portion 16 has a thickness in the range of, for example, 3 to 20 μmm, or preferably 5 to 20 μm. The thickness of the lower portion 22 of the ground connecting portion 16 is the same as that of the insulating base layer 13.

Then, in this method, as shown in FIG. 4(d), the semiconductive layer 9 is formed so as to be continuous with the surface of the conductive pattern 14, the surface of the upper portion 23 of the ground connecting portion 16, the surface of the insulating base layer 13 exposed from the conductive pattern 14 and the upper portion 23 of each of the ground connecting portions 16, and the surface of the metal supporting layer 12 exposed from the insulating base layer 13.

Metal or resin is used as a semiconductive material for forming the semiconductive layer 9.

The metal such as metal-Oxide is used, for example. Examples of the metal oxide include chromium oxide, nickel oxide, copper oxide, titanium oxide, zirconium oxide, indium oxide, aluminum oxide, and zinc oxide, or chromium oxide is preferably used.

The method for forming the semiconductive layer 9 of metal oxide is not particularly limited. For example, the semiconductive layer 9 can be formed by a method of sputtering a metal as a target, then to oxide by heat, as required, a method of reactive sputtering, or a method of sputtering a metal oxide as a target.

In the method of oxidizing a metal as a target after sputtering by heat, as required, for example, a metal such as chromium is sputtered as a target by a sputtering method of introducing an inert gas such as argon as an introduced gas. Thereafter, the semiconductive layer 9 of metal oxide is formed by oxidizing by heating at 50 to 400° C. for 1 minute to 12 hours in the atmosphere using a heating furnace or the like, as required.

In the method of reactive sputtering, a metal such as chromium is sputtered as a target, for example, in a sputtering apparatus, and a reactive gas containing oxygen is introduced as an introduced gas to form the semiconductive layer 9 of metal oxide.

In the method of sputtering a metal oxide as a target, a metal oxide such as chromium oxide is sputtered as the target, for example, in a sputtering apparatus, and an inert gas such as argon is introduced as the introduced gas to form the semiconductive layer 9 of metal oxide.

This semiconductive layer 9 can be formed, for example, according to the description of Japanese Unexamined Patent Publication No. 2004-335700.

The resin that may be used includes, for example, semiconductive resin composition in which conductive particles are dispersed.

The semiconductive resin composition contains, for example an imide resin or an imide resin precursor, conductive particles, and a solvent.

A known imide resin can be used as the imide resin. Examples of the imide resin include polyimide, polyether imide, and polyamide imide, or the like.

The imide resin precursor that may be used includes, for example, the imide resin precursor described in Japanese Unexamined Patent Publication No. 2004-35825. Examples of the imide resin precursor include a polyamic acid resin.

The conductive particle that may be used includes, for example, conductive polymer particles, carbon particles, metal particles, and metal oxide particles.

The conductive polymer particles that may be used includes, for example, particles of, such as polyaniline, polypyrrole, or polythiophene, or particles of a derivative thereof. Preferably, polyaniline particles are used. Doping using a doping agent imparts conductivity to the conductive polymer particles.

The doping agent that may be used includes, for example, p-toluenesulfonic acid, dodecylbenzenesulfonic acid, alkylnaphthalenesulfonic acid, polystyrenesulfonic acid, p-toluenesulfonic acid novolac resin, p-phenolsulfonic acid novolac resin, and β-naphthalenesulfonic acid-formalin condensate.

The doping agent may be previously added into a solvent in which conductive polymer particles are dispersed (dissolved). Alternatively, after the semiconductive layer 9 is formed, the suspension board with circuit 1 having the semiconductive layer 9 thus formed during production may be dipped in the solution of the doping agent.

The carbon particles that may be used include, for example, carbon black particles, for example, a carbon nanofiber.

The metal particles that may be used include, for example, particles of, such as chromium, nickel, copper, titanium, zirconium, indium, aluminum, or zinc.

The metal oxide particles that may be used include, for example, particles of, such as chromium oxide, nickel oxide, copper oxide, titanium oxide, zirconium oxide, indium oxide, aluminum oxide, or zinc oxide, or particles of a composite oxide thereof. More specifically, particles such as a composite oxide of indium oxide and tin oxide (ITO particles), or particles a composite oxide of tin oxide and phosphorus oxide (PTO particles) are used as the metal oxide particles.

These conductive particles can be used alone or in combination of two or more kinds. Preferably, the ITO particles are used.

The conductive particles have an average particle diameter in the range of, for example, 10 nm to 1 μm, or preferably 10 nm to 400 nm, or more preferably 10 nm to 100 nm. In the case where the conductive particles are composed of a carbon nanofiber, the diameter thereof is in the range of 100 to 200 nm, and the length thereof is in the range of 5 to 20 μm, for example. When the average particle size (diameter) is smaller than those listed above, the adjustment of the average particle size (diameter) may be difficult. Conversely, when the average particle size (diameter) is larger than those listed above, the conductive particles may be unsuitable for coating.

The solvent that may be used is not particularly limited as long as an imide resin or an imide resin precursor, and conductive particles can be dispersed (dissolved) therein. Examples of the solvent include an aprotic polar solvent, such as N-methyl-2-pyrrolidone (NMP), N,N-dimethylacetamide, N,N-dimethylformamide, and dimethyl sulfoxide. These solvents can be used alone or in combination of two or more kinds.

The semiconductive resin composition can be prepared by mixing the imide resin or the imide resin precursor, the conductive particles, and the solvent.

The mixing ratio of the conductive particles is, for example, 1 to 300 parts by weight, or preferably 5 to 100 parts by weight, based on 100 parts by weight of the imide resin or the imide resin precursor. A lower mixing ratio of the conductive particles than this range may result in insufficient conductivity. Conversely, a higher mixing ratio of the conductive particles than this range may impair the good coating property of the imide resin or the imide resin precursor.

The solvent is mixed such that the total volume of the imide resin or the imide resin precursor, and the conductive particles is in the range of, for example, 1 to 40% by weight (solids concentration), or preferably 5 to 30% by weight (solids concentration), based on the semiconductive resin composition. Either a lower or a higher solids concentration than the above range may cause difficulties in controlling to the intended coating thickness.

The semiconductive resin composition thus prepared is uniformly coated over the surface of the conductive pattern 14, the surface of the upper portion 23 of each of the ground connecting portions 16, the surface of the insulating base layer 13 exposed from the conductive pattern 14 and the upper portion 23 of each of the ground connecting portions 16, and the surface of the metal supporting layer 12 exposed from the insulating base layer 13, for example, by a known coating method, such as roll coating, gravure coating, spin coating, or bar coating. Thereafter, the coated semiconductive resin composition is heated to dry at a temperature in the range of, for example, 60 to 250° C., or preferably 80 to 200° C., for example, for 1 to 30 minutes, or preferably for 3 to 15 minutes.

In the case where the semiconductive resin composition contains an imide resin precursor, the semiconductive resin composition is dried, and thereafter, heated at 250° C. or higher under reduced pressure, to be cured (imidized).

Therefore, the semiconductive layer 9 can be formed continuously with the surface of the conductive pattern 14, the surface of the upper portion 23 of each of the ground connecting portions 16, the surface of the insulating base layer 13 exposed from the conductive pattern 14 and the upper portion 23 of each of the ground connecting portions 16, and the surface of the metal supporting layer 12 exposed from the insulating base layer 13.

The semiconductive layer 9 thus formed has a thickness of, for example, 40 μm or less, or preferably in the range of 3 to 20 μm.

The surface resistance value of the semiconductive layer 9 is set in the range of, for example, $10^5$ to $10^{13} \Omega/\square$, or preferably $10^5$ to $10^{11} \Omega/\square$, or more preferably $10^6$ to $10^9 \Omega/\square$. When the surface resistance value of the semiconductive layer 9 is smaller than this range, malfunction of the magnetic head mounted thereon may arise. Conversely, when the surface resistance value of the semiconductive layer 9 is larger than this range, an electrostatic breakdown may not be prevented.

Then, in this method, as shown in FIG. 4(e), the first insulating cover layer 15A is formed on the semiconductive layer 9 in the electrostatic charge removing portion 3 (except for the front end portion thereof) in the above-mentioned pattern in the same position as the above-mentioned semiconductive layer 9 to correspond to the shape of the semiconductive layer 9 in plane view.

The first insulating cover layer 15A is composed of the same resin as that used for the insulating base layer 13, preferably a photosensitive synthetic resin, or more preferably, photosensitive polyimide.

The method for forming the first insulating cover layer 15A in the above-mentioned pattern is not particularly limited and a known method is used. For example, a varnish of photosensitive resin (photosensitive polyamic acid resin) is coated over a surface of the semiconductive layer 9, and the coated varnish is dried to form a first cover coating. Subsequently, the first cover coating is exposed to light via a photomask, and then heated as required and developed to form the above-mentioned pattern. Then, for example, the pattern is heated at 250° C. or higher under reduced pressure to be cured (imidized).

The first insulating cover layer 15A thus formed has a thickness in the range of, for example, 2 to 10 μm, or preferably 3 to 5 μm.

Then, in this method, as shown in FIG. 5(f), the semiconductive layer 9 exposed from the first insulating cover layer 15A is removed by etching.

For example, as an etchant, an alkaline aqueous solution such as a potassium hydroxide aqueous solution is used, and wet etching is performed by a dipping or spraying method, using the first insulating cover layer 15A as an etching resist.

Therefore, the semiconductive layer 9 can be formed in the electrostatic charge removing portion 3 (except for the front end portion thereof) in the above-mentioned pattern so as to be formed in the same position as the first insulating cover layer 15A in plane view.

Then, in this method, as shown in FIG. 5(g), the second insulating cover layer 15B is formed on the insulating base layer 13 so as to cover the first insulating cover layer 15A in the electrostatic charge removing portion 3 and so as to cover the conductive pattern 14 in the wired circuit body portion 2, thereby forming the insulating cover layer 15 in the above-mentioned pattern.

The second insulating cover layer 15B is composed of the same resin as that used for the first insulating cover layer 15A, preferably a photosensitive synthetic resin, or more preferably, photosensitive polyimide.

The method for forming the second insulating cover layer 15B in the above-mentioned pattern is not particularly limited and a known method is used. For example, a varnish of photosensitive resin (photosensitive polyamic acid resin) is coated over a surface of the first insulating cover layer 15A, a surface of each of the ground connecting portions 16, a surface of the insulating base layer 13, and a surface of the metal supporting layer 12, and the coated varnish is dried to form a second cover coating. Subsequently, the second cover coating is exposed to light via a photomask, and then heated as required and developed to form the above-mentioned pattern (pattern in which the magnetic-head-side connecting terminal portion 7, the external connecting terminal portion 8, and the test-side connecting terminal portion 10 are opened). Then, for example, the pattern is heated at 250° C. or higher under reduced pressure to be cured (imidized).

The second insulating cover layer 15B thus formed has a thickness in the range of, for example, 1 to 40 μm, or preferably 1 to 7 μm.

In the electrostatic charge removing portion 3, a total thickness of the first insulating cover layer 15A and the second insulating cover layer 15B in a portion in which these insulating cover layers are laminated is in the range of, for example, 3 to 20 μm, or preferably 5 to 15 μm.

The second insulating cover layer 15B is thus formed on the insulating base layer 13 in the above-mentioned pattern, thereby forming the insulating cover layer 15 including the first insulating cover layer 15A and the second insulating cover layer 15B.

Then, in this method, as shown in FIG. 5(h), the metal opening 20 is formed in the metal supporting layer 12.

The metal opening 20 is opened by, for example, etching (for example, wet etching), laser processing, or the like, or preferably by wet etching.

In order to perform wet etching, first, the backside of the metal supporting layer 12 in a portion other than those having the metal opening 20 in the metal supporting layer 12 is covered with etching resist. Subsequently, the metal supporting layer 12 exposed from the etching resist is removed using a known etching solution such as a ferric chloride solution. Thereafter, the etching resist is removed.

Then, in this method, as shown in FIG. 5(i), the notch 18 is formed in the insulating base layer 13 and the insulating cover layer 15 in the conduction cut-off portion 4.

The notch 18 is formed by a known method such as using infrared laser or ultraviolet laser, or stamping with die. Preferably, the notch 18 is formed by a UV laser ablation method.

Thereafter, as shown in FIG. 1, the metal supporting layer 12 is cut out by chemical etching, and trimmed to obtain the suspension board with circuit 1.

The suspension board with circuit 1 thus obtained is shipped and transported as a product, for example, a magnetic head is mounted on the suspension board with circuit 1 at a magnetic head assembly plant.

Here, due to the vibration during the shipment and transportation, static electricity may be produced by friction or the like on the suspension board with circuit 1 after production, and thus charged on the suspension board with circuit 1.

However, according to the suspension board with circuit 1, before a magnetic head is mounted on the wired circuit body portion 2, that is, during the above-mentioned shipment and transportation, the static electricity charged on the wired circuit body portion 2 can be efficiently removed via the semiconductive layer 9 of the electrostatic charge removing portion 3 that is conducted (electrically conducted) with the wired circuit body portion 2.

More specifically, the semiconductive layer 9 is electrically connected with the metal supporting layer 12 via the ground connecting portion 16, thereby allowing to efficiently remove the static electricity charged on the conductive pattern 14 from the semiconductive layer 9 to the metal supporting layer 12.

The electrostatic charge removing portion 3 is arranged adjacent to the wired circuit body portion 2, so that electrical conduction between the electrostatic charge removing portion 3 and the wired circuit body portion 2 can be secured reliably before mounting of a magnetic head, that is, during the above-mentioned shipment and transportation. Further, since the suspension board with circuit 1 has the electrostatic charge removing portion 3 arranged adjacent to the wired circuit body portion 2, the conduction cut-off portion 4 can be easily arranged between the electrostatic charge removing portion 3 and the wired circuit body portion 2, thereby allowing to form the electrostatic charge removing portion 3 and the wired circuit body portion 2 integrally and continuously.

At the magnetic head assembly plant, a continuity test is performed on the main wired circuit 5 of the suspension board with circuit 1 before mounting of a magnetic head.

In the continuity test, since the test-side connecting terminal portions 10 are connected to the auxiliary wired circuit 11, which is then connected to the main wired circuit 5, the continuity test can be performed on the main wired circuit 5 by connecting a continuity test probe to the test-side connecting terminal portion 10.

Then, the electrostatic charge removing portion 3 is separated (removed) from the wired circuit body portion 2 using the conduction cut-off portion 4 as a boundary, to cut off the electrical conduction between the wired circuit body portion 2 and the electrostatic charge removing portion 3. Thereafter, the magnetic head is mounted on the wired circuit body portion 2.

According to this suspension board with circuit 1, after the magnetic head is mounted on the wired circuit body portion 2, the wired circuit body portion 2 and the electrostatic charge removing portion 3 are separated by the conduction cut-off portion 4, thereby allowing to prevent the main wired circuit 5 of the wired circuit body portion 2 from being electrically affected by the semiconductive layer 9 of the electrostatic charge removing portion 3. Accordingly, the electrical stability of the wired circuit body portion 2 can be reliably secured.

More specifically, according to the suspension board with circuit 1, the electrostatic charge removing portion 3 is arranged adjacent to the rear end portion of the wired circuit body portion 2. That is the electrostatic charge removing portion 3 is arranged on the outer side of the lengthwise direction in a direction along the main wired circuit 5, with respect to the main wired circuit 5 between the magnetic-head-side connecting terminal portion 7 and the external connecting terminal portion 8, namely, on the rear side of the wired circuit body portion 2. Hence, after a magnetic head is mounted on the magnetic-head-side connecting terminal portion 7, electrical conduction between the wired circuit body portion 2 and the electrostatic charge removing portion 3 can be cut off reliably by simply removing the electrostatic charge removing portion 3 arranged on the rear side thereof using the conduction cut-off portion 4 as a boundary, which reliably prevents the semiconductive layer 9 from electrically affecting the magnetic-head-side connecting terminal portions 7 and the external connecting terminal portions 8, and the main wired circuit 5 therebetween.

Further, since the conduction cut-off portion 4 is used as a boundary to only separate the electrostatic charge removing portion 3 from the wired circuit body portion 2, electrical conduction between the wired circuit body portion 2 and the electrostatic charge removing portion 3 can be reliably cut off by the conduction cut-off portion 4.

Further, the separation at the conduction cut-off portion 4 as a boundary is performed simply by tearing off the electrostatic charge removing portion 3 from the wired circuit body portion 2 along the notches 18, so that the wired circuit body portion 2 and the electrostatic charge removing portion 3 can be easily separated by the conduction cut-off portion 4, thereby allowing to easily cut off the electrical conduction therebetween.

In the production method of the above-mentioned suspension board with circuit 1, the first insulating cover layer 15A is formed, and the semiconductive layer 9 is then formed by using the first insulating cover layer 15A thus formed as an etching resist. However, a known etching resist 19 can be used as a resist to form the semiconductive layer 9 without forming the first insulating cover layer 15A.

FIG. 6 is a sectional view illustrating another process of producing a suspension board with circuit shown in FIGS. 4 and 5.

In this method, as shown in FIG. 4(d), the semiconductive layer 9 is formed so as to be continuous with each surface of the conductive pattern 14, the ground connecting portion 16, the insulating base layer 13, and the metal supporting layer 12. Thereafter, as shown in FIG. 6(a), the etching resist 19 is formed on the semiconductive layer 9 in the electrostatic charge removing portion 3 (except for the front end portion thereof) in the above-mentioned pattern so as to be formed in the same position as the above-mentioned semiconductive layer 9 corresponding to the shape of the semiconductive layer 9 in plane view.

The etching resist 19 is formed in the above-mentioned pattern by a known method, such as using a dry film resist or the like.

Then, in this method, as shown in FIG. 6(b), the semiconductive layer 9 exposed from the etching resist 19 is removed by etching (wet etching).

Then, in this method, as shown in FIG. 6(c), the etching resist 19 is removed by a known etching method such as a wet etching, or by stripping.

Then, in this method, as shown in FIG. 6(d), the insulating cover layer 15 is formed in the above-mentioned pattern as in the same manner as above.

For example, a varnish of photosensitive resin (photosensitive polyamic acid resin) is coated over surfaces of the semiconductive layer 9, each of the ground connecting portions 16, the insulating base layer 13, and the metal supporting layer 12, and the coated varnish is dried to form a cover coating. Subsequently, the cover coating is exposed to light via a photomask, and then heated as required and developed to form the above-mentioned pattern. Then, for example, the pattern is heated at 250° C. or higher under reduced pressure to be cured (imidized).

The insulating cover layer 15 thus formed has a thickness in the range of, for example, 1 to 40 μm, or preferably 1 to 7 μm.

Thereafter, in this method, as described above, the metal opening 20 is formed in the metal supporting layer 12 as shown in FIG. 5(h) and, the notch 18 is then formed in the insulating base layer 13 and insulating cover layer 15 of the conduction cut-off portion 4, as shown in FIG. 5(i).

Thus, the suspension board with circuit 1 can also be obtained by forming the semiconductive layer 9 with the known etching resist 19 as an etching resist, and without forming the first insulating cover layer 15A.

According to this method, an insulating cover layer having an uniform thickness can be formed in the electrostatic charge removing portion 3, without producing a difference between the total thickness of the first insulating cover layer 15A and the second insulating cover layer 15B in the above-mentioned laminated portion, and the thickness of the second insulating cover layer 15B. Accordingly, the suspension board with circuit 1 having a thinner shape can be obtained.

In the above explanation, the semiconductive layer 9 of the suspension board with circuit 1 is electrically connected to the metal supporting layer 12 via the ground connecting portion 16 without contacting the metal supporting layer 12. However, for example, as shown in FIG. 7, the semiconductive layer 9 of the suspension board with circuit 1 may be directly contact with the metal supporting layer 12.

FIGS. 7 through 10 are sectional views corresponding to FIG. 3, showing a suspension board with circuit as other embodiments of a wired circuit board according to the present invention, in which a semiconductive layer directly contacts a metal supporting layer. FIG. 7 shows an embodiment in which the semiconductive layer is interposed between an auxiliary wired circuit and an insulating cover layer. FIG. 8 shows an embodiment in which the semiconductive layer is interposed between an auxiliary wired circuit and an insulating base layer. FIG. 9 shows an embodiment in which the semiconductive layer is formed on the surface of an insulating cover layer, and FIG. 10 shows an embodiment in which the semiconductive layer is formed on the surface of an insulating base layer and the surface of an auxiliary wired circuit, and also formed on the surface of an insulating cover layer. The same reference numerals are used in each of the subsequent figures for the same members as those above, and the description thereof is omitted.

In FIG. 7, the insulating base layer 13 is formed on the above-mentioned metal supporting layer 12 corresponding to a portion where the conductive pattern 14 is formed in a pattern to expose a peripheral end portion of the metal supporting layer 12. The insulting base layer 13 is not formed with the base opening 17 shown in FIG. 3.

The semiconductive layer 9 is formed on the insulating base layer 13 covered with the first insulating cover layer 15A so as to cover the auxiliary wired circuit 11. More specifically, the semiconductive layer 9 is formed on the upper surface and both the widthwise side surfaces of each of the auxiliary wirings 21 in the auxiliary wired circuit 11, the upper surface, both the widthwise side surfaces (in the right-side figure of FIG. 7), and the lengthwise rear end side surface (in the left-side figure of FIG. 7) of the insulating base layer 13 exposed from each of the auxiliary wirings 21, and the lower end surface of the semiconductive layer 9 formed on both the widthwise side surfaces and the lengthwise rear end side surface of the insulating base layer 13 is in direct contact with the upper surface of the metal supporting layer 12 exposed from both the widthwise side surfaces and the lengthwise rear end side surface of the insulating base layer 13. Therefore, the semiconductive layer 9 is electrically connected with the metal supporting layer 12.

The insulating cover layer 15 is formed on the insulating base layer 13 so as to cover the conductive pattern 14 and the semiconductive layer 9, and so as to cover the peripheral end portion of the metal supporting layer 12 exposed from the insulating base layer 13. In order to obtain this suspension board with circuit 1, though not shown, for example, a metal supporting layer 12 is first prepared, an insulating base layer 13 is formed on the metal supporting layer 12 in the above-mentioned pattern so as to correspond to a portion where a conductive pattern 14 is formed, and the conductive pattern 14 is then formed on the insulating base layer 13 in the above-mentioned pattern (pattern of the main wired circuit 5 and the auxiliary wired circuit 11). Subsequently, a semiconductive layer 9 is formed so as to be continuous with each surface of the conductive pattern 14, the insulating base layer 13, and the metal supporting layer 12, and the first insulating cover layer 15A is then formed in the electrostatic charge removing portion 3 (except for the front end portion thereof) in the above-mentioned pattern in the same position as the above-mentioned semiconductive layer 9 to correspond to the shape of the semiconductive layer 9 in plane view.

Next, the semiconductive layer 9 exposed from the first insulating cover layer 15A is removed by etching. This etching is performed to leave the semiconductive layer 9 formed on the side surfaces (both widthwise side surfaces and lengthwise rear end side surface) of the insulating base layer 13.

Then, the second insulating cover layer 15B is formed on the insulating base layer 13 in the above-mentioned pattern so as to cover the peripheral end portion of the metal supporting layer 12 exposed from the first insulating cover layer 15A and the insulating base layer 13 in the electrostatic charge removing portion 3, and so as to cover the peripheral end portion of the metal supporting layer 12 exposed from the conductive pattern 14 and the insulating base layer 13 in the wired circuit body portion 2. Subsequently, a metal opening 20 is formed in the metal supporting layer 12 and thereafter, a notch 18 is formed in the insulating base layer 13 and insulating cover layer 15 of the conduction cut-off portion 4.

This method does not need to provide the ground connecting portion 16 together during the formation of the conductive pattern 14, so that the suspension board with circuit 1 can be easily produced.

In the above explanation, the semiconductive layer 9 has been interposed between the auxiliary wired circuit 11 and the insulating cover layer 15 in FIG. 7. However, the arrangement is not limited thereto as long as the semiconductive layer 9 is arranged in the electrostatic charge removing portion 3, for example, the semiconductive layer 9 may be interposed between the auxiliary wired circuit 11 and the insulating base layer 13, as shown in FIG. 8.

In FIG. 8, the semiconductive layer 9 is formed in the electrostatic charge removing portion 3 (except for the front end portion thereof) so as to be interposed between the insulating base layer 13 and the auxiliary wired circuit 11.

In order to obtain this suspension board with circuit 1, though not shown, for example, a metal supporting layer 12 is first prepared, and an insulating base layer 13 is formed on the metal supporting layer 12 in a pattern so as to correspond to a portion where a conductive pattern 14 is formed. Subsequently, a semiconductive layer 9 is formed so as to be continuous with each surface of the insulating base layer 13, and the metal supporting layer 12, and the conductive pattern 14 is then formed on the semiconductive layer 9 in the above-mentioned pattern (pattern of the main wired circuit 5 and the auxiliary wired circuit 11), and thereafter, the first insulating cover layer 15A is formed in the electrostatic charge removing portion 3 in the above-mentioned pattern in the same position as the above-mentioned semiconductive layer 9 to correspond to the shape of the semiconductive layer 9 in plane view.

Next, the semiconductive layer 9 exposed from the first insulating cover layer 15A is removed by etching. This etching is performed to leave the semiconductive layer 9 formed on the side surfaces (both widthwise side surfaces and lengthwise rear end side surface) of the insulating base layer 13.

Then, the second insulating cover layer 15B is formed on the insulating base layer 13 so as to cover the peripheral end portion of the metal supporting layer 12 exposed from the first insulating cover layer 15A and the insulating base layer 13 in the electrostatic charge removing portion 3, and so as to cover the peripheral end portion of the metal supporting layer 12 exposed from the conductive pattern 14 and the insulating base layer 13 in the wired circuit body portion 2 in the above-mentioned pattern. Subsequently, a metal opening 20 is formed in the metal supporting layer 12 and thereafter, a notch 18 is formed in the insulating base layer 13 and insulating cover layer 15 of the conduction cut-off portion 4.

In addition to the above-mentioned methods, in order to obtain this suspension board with circuit 1, though not shown, for example, a metal supporting layer 12 is first prepared, and an insulating base layer 13 is formed on the metal supporting layer 12 in a pattern so as to correspond to a portion where a conductive pattern 14 is formed. Subsequently, a thin conductive film (seed layer) in which a thin chromium film and a thin copper film are sequentially laminated by chromium sputtering and copper sputtering is formed on each surface of the insulating base layer 13 and the metal supporting layer 12. Thereafter, the conductive pattern 14 is formed on the thin conductive film in the above-mentioned pattern (pattern of the main wired circuit 5 and the auxiliary wired circuit 11), by the additive method. Next, the thin copper film exposed from the conductive pattern 14 is removed by etching to leave the thin chromium film. The thin chromium film thus exposed by the removal is subjected to semiconductive treatment in oxidizing by heat to form a semiconductive layer 9. Then, the first insulating cover layer 15A is formed in the electrostatic charge removing portion 3 (except for the front end portion thereof) in a pattern in the same position as the above-mentioned semiconductive layer 9 in plane view.

Next, the semiconductive layer 9 exposed from the first insulating cover layer 15A is removed by etching. This etching is performed to leave the semiconductive layer 9 formed on the side surfaces (both widthwise side surfaces and lengthwise rear end side surface) of the insulating base layer 13.

Then, the second insulating cover layer 15B is formed on the insulating base layer 13 so as to cover the peripheral end portion of the metal supporting layer 12 exposed from the first insulating cover layer 15A and the insulating base layer 13 in the electrostatic charge removing portion 3, and so as to cover the peripheral end portion of the metal supporting layer 12 exposed from the conductive pattern 14 and the insulating base layer 13 in the wired circuit body portion 2 in the above-mentioned pattern.

According to this method, the above-mentioned suspension board with circuit 1 shown in FIG. 8 can be produced easily and efficiently.

In the above explanation, although the semiconductive layer 9 has been formed on the surface of the insulating base layer 13 in FIG. 8, the formation is not limited thereto, and the semiconductive layer 9 may be formed on the surface of the insulating cover layer 15 as shown in FIG. 9.

In FIG. 9, the semiconductive layer 9 is formed on the surface of the insulating cover layer 15 in the electrostatic charge removing portion 3 (except for the front end portion thereof). More specifically, the semiconductive layer 9 is formed on the upper surface, both the widthwise side surfaces, and the lengthwise rear end side surface of the insulating cover layer 15, and the lower end surface of the semiconductive layer 9 formed on both the widthwise side surfaces and the lengthwise rear end side surface of the insulating cover layer 15 is in direct contact with the upper surface of the metal supporting layer 12 exposed from both the widthwise side surfaces and the lengthwise rear end side surface of the insulating cover layer 15. Therefore, the semiconductive layer 9 is electrically connected with the metal supporting layer 12. In order to obtain this suspension board with circuit 1, though not shown, for example, a metal supporting layer 12 is first prepared, and an insulating base layer 13 is formed on the metal supporting layer 12 in the above-mentioned pattern so as to correspond to a portion where a conductive pattern 14 is formed. Subsequently, the conductive pattern 14 is formed on the insulating base layer 13 in the above-mentioned pattern (pattern of the main wired circuit 5 and the auxiliary wired circuit 11), an insulating cover layer 15 is formed in the above-mentioned pattern in the same manner as above, and a semiconductive layer 9 is formed on the surface of the insulating cover layer 15.

A known method is used to form the semiconductive layer 9 on the surface of the insulating cover layer 15. The semiconductive layer 9 can be formed, for example, according to the description in paragraphs [0021] to [0027] of Japanese Unexamined Patent Publication No. 2003-152383, the description in paragraphs [0034] to [0052] of Japanese Unexamined Patent Publication No. 2004-335700, or the like.

Subsequently, a metal opening 20 is formed in the metal supporting layer 12 and thereafter, a notch 18 is formed in the insulating base layer 13 and insulating cover layer 15 of the conduction cut-off portion 4.

In the above explanation, although the semiconductive layer 9 is formed on the surface of the auxiliary wired circuit 11 and the surface of the insulating base layer 13 (in FIG. 7), or on the surface of the insulating cover layer 15 (in FIG. 9), the formation is not limited thereto, for example, the semiconductive layer 9 may be formed on the surfaces of all these layers.

In FIG. 10, the semiconductive layer 9 is formed on the surface of the insulating base layer 13 and the surface of the auxiliary wired circuit 11, and also formed on the surface of the insulating cover layer 15.

In order to obtain this suspension board with circuit 1, though not shown, for example, as described above, the metal supporting layer 12, the insulating base layer 13, and the conductive pattern 14 are sequentially formed, and a semiconductive layer 9 is then formed on the conductive pattern 14 in the same method as for the suspension board with circuit 1 of FIG. 7. Subsequently, the insulating cover layer 15 is formed, and thereafter, a semiconductive layer 9 is formed on the surface of the insulating cover layer 15 in the same method as for the suspension board with circuit 1 of FIG. 9.

In this way, the semiconductive layer 9 is formed on the surfaces of the insulating base layer 13, the auxiliary wired circuit 11 and the insulating cover layer 15, whereby static electricity charged on the wired circuit body portion 2 can be more efficiently removed via the two semiconductive layers 9 before a magnetic head is mounted on the wired circuit body portion 2.

In the above explanation, as shown in FIG. 2, one conduction cut-off portion 4 is formed on the suspension board with circuit 1. However, the number is not limited thereto, for example, as shown in FIG. 11, two conduction cut-off portions (the conduction cut-off portion 4, and the auxiliary conduction cut-off portion 26 mentioned later) may be formed.

In FIG. 11, the electrostatic charge removing portion 3 includes a test-side connecting terminal portion forming portion 27 as a third terminal portion forming portion, a semiconductive layer forming portion 28, and an auxiliary conduction cut-off portion 26 formed between the test-side connecting terminal portion forming portion 27 and the semiconductive layer forming portion 28.

The test-side connecting terminal portion forming portion 27 is formed as a region where the above-mentioned test-side connecting terminal portion 10 is formed, and arranged adjacent to the rear end side of the auxiliary conduction cut-off portion 26.

The semiconductive layer forming portion 28 is formed as a region where the semiconductive layer 9 is formed, and arranged between the auxiliary conduction cut-off portion 26 and the conduction cut-off portion 4.

The auxiliary conduction cut-off portion 26 is linearly arranged along the widthwise direction between the test-side connecting terminal portion forming portion 27 and the semiconductive layer forming portion 28, and it is possible to separate the test-side connecting terminal portion forming portion 27 from the semiconductive layer forming portion 28 using the auxiliary conduction cut-off portion 26 as a boundary. More specifically, in the same manner as for the above-mentioned conduction cut-off portion 4, the auxiliary conduction cut-off portion 26 has perforated notches 18 formed by intermittently removing the insulating base layer 13 and the insulating cover layer 15 over the widthwise direction.

In the metal supporting layer 12, the above-mentioned metal opening 20 is formed so as to expose the conduction cut-off portion 4, and the auxiliary metal opening 25 is also formed so as to expose each backside of the auxiliary conduction cut-off portion 26, and the test-side connecting terminal portion forming portion 27 and the semiconductive layer forming portion 28 both of which are continuous with the auxiliary conduction cut-off portion 26.

The semiconductive layer 9 is provided only in the semiconductive layer forming portion 28, and formed in a generally rectangular shape in plane view over the widthwise direction thereof.

At the magnetic head assembly plant, in the suspension board with circuit 1, the test-side connecting terminal portion forming portion 27 is separated (removed) from the semiconductive layer forming portion 28 using the auxiliary conduction cut-off portion 26 as a boundary to cut off the electrical conduction between the semiconductive layer forming portion 28 and the test-side connecting terminal portion forming portion 27, and thereafter, a magnetic head is mounted on the wired circuit body portion 2.

More specifically, according to the suspension board with circuit 1, the test-side connecting terminal portion forming portion 27 is arranged adjacent to the rear end portion of the semiconductive layer forming portion 28, that is, the test-side connecting terminal portion forming portion 27 is arranged on the rear side of the semiconductive layer forming portion 28. Hence, by simply removing the test-side connecting terminal portion forming portion 27 thus arranged on the rear side using the auxiliary conduction cut-off portion 26 as a boundary, the electrical conduction between the semiconductive layer forming portion 28 and the test-side connecting terminal portion forming portion 27 can be reliably cut off after a magnetic head is mounted thereon.

The separation at the boundary of the auxiliary conduction cut-off portion 26 is performed simply by tearing off the test-side connecting terminal portion forming portion 27 from the semiconductive layer forming portion 28 along the notches 18, so that the semiconductive layer forming portion 28 and the test-side connecting terminal portion forming portion 27 can be easily separated by the auxiliary conduction cut-off portion 26, thereby allowing to easily cut off the electrical conduction therebetween.

In this suspension board with circuit 1, even if the test-side connecting terminal portion forming portion 27 is separated from the semiconductive layer forming portion 28, the semiconductive layer forming portion 28 is still formed with the semiconductive layer 9. Therefore, for example, when the suspension board with circuit 1 after a magnetic head is mounted thereon is further transported, for example, at a hard disk drive assembly plant, the suspension board with circuit 1 is mounted on a hard disk drive, static electricity charged on the suspension board with circuit 1 before the mounting can also be efficiently removed.

At the hard disk drive assembly plant, the semiconductive layer forming portion 28 is separated (removed) from the wired circuit body portion 2 using the conduction cut-off portion 4 as a boundary to cut off the electrical conduction between the wired circuit body portion 2 and the semiconductive layer forming portion 28. Thereafter, the wired circuit body portion 2 is mounted on the hard disk drive (a read/write board is mounted on the external connecting terminal portion 8 of the wired circuit body portion 2).

According to this suspension board with circuit 1, after the wired circuit body portion 2 is mounted on a hard disk drive, the electrical conduction between the wired circuit body portion 2 and the semiconductive layer forming portion 28 is already cut off by the conduction cut-off portion 4, so that it is possible to prevent the main wired circuit 5 of the wired circuit body portion 2 from being electrically affected by the semiconductive layer 9 of the semiconductive layer forming portion 28. Accordingly, electrical stability of the wired circuit body portion 2 can be reliably secured.

In the above explanation, as shown in FIG. 2, the electrostatic charge removing portion 3 and the wired circuit body portion 2 are formed so as to be physically separable by the notches 18. However, the separation is not limited thereto as long as the electrical conduction between the electrostatic charge removing portion 3 and the wired circuit body portion 2 can be cut off. For example, as shown by alternate long and short dashed lines in FIG. 11, when a support 29, which is extended between the electrostatic charge removing portion 3 (test-side connecting terminal portion forming portion 27) and the wired circuit body portion 2 and formed so as to bypass the conduction cut-off portion 4 in the lengthwise direction, is integrally formed with the electrostatic charge removing portion 3 and with the metal supporting layer 12 of the wired circuit body portion 2, the electrical conduction between the electrostatic charge removing portion 3 and the wired circuit body portion 2 may also be cut off using the conduction cut-off portion 4 as a boundary, while the electrostatic charge removing portion 3 and the wired circuit body portion 2 continue to be coupled via the support 29 without physical separation therebetween.

In the above explanation, two ground connecting portions 16 are formed. However, the number is not limited thereto.

For example, though not shown, only one ground connecting portion 16 may be formed so as to be spaced apart on one widthwise outside from the auxiliary wired circuit 11.

In the above explanation, the ground connecting portion 16 is formed in a generally rectangular shape in plane view. However, the shape is not limited thereto, and the ground connecting portion 16 can also be formed in an appropriate shape such as, for example, in a generally circular shape in plane view.

Further, in the above explanation, the semiconductive layer 9 is formed in a generally rectangular shape in plane view. However, the shape is not limited thereto as long as the semiconductive layer 9 is formed in the electrostatic charge removing portion 3 (or in the semiconductive layer forming portion 28). The semiconductive layer 9 can be formed in an appropriate shape depending on the purpose, application, and product design.

In the above explanation, the semiconductive layer 9 is formed only in the electrostatic charge removing portion 3. However, the formation is not limited thereto as long as the semiconductive layer 9 is formed in the electrostatic charge removing portion 3. For example, as shown in phantom line in FIG. 11, the semiconductive layer 9 can also be formed in a generally L-shape extending from the lengthwise front end portion of one widthwise side end portion in the portion of the generally rectangular shape in plane view toward the lengthwise front end side to the rear end portion of the wired circuit body portion 2.

An extended portion 30 extending to the rear end portion of the wired circuit body portion 2 is arranged in spaced relation to the main wired circuit 5 and the external connecting terminal portion 8 in the wired circuit body portion 2 in the widthwise direction. The extended portion 30 is formed on the insulating base layer 13 so as to be covered with the insulating cover layer 15, and the ground connecting portion 16 formed on the metal supporting layer 12 is provided at the front end portion of the extended portion 30. Thus, the extended portion 30 contacts the insulating base layer 13 and the ground connecting portion 16 on the lower side in the thickness direction, and contacts the insulating cover layer 15 on the upper side in the thickness direction.

Accordingly, when the semiconductive layer 9 is formed in a generally L-shape having the extended portion 30, even if, for example, the electrostatic charge removing portion 3 is so narrow in the widthwise direction and it is difficult to secure a spacing for providing the ground connecting portion 16 in the electrostatic charge removing portion 3, the semiconductive layer 9 is allowed to come into contact with the metal supporting layer 12 by extending the extended portion 30 in the wired circuit body portion 2 to provide the ground connecting portion 16 at its front end portion.

Even if the extended portion 30 of the semiconductive layer 9 is thus provided in the wired circuit body portion 2, the semiconductive layer 9 is formed in the electrostatic charge removing portion 3, thereby allowing to remove static electricity charged on the wired circuit body portion 2 before mounting of a magnetic head. Further, after the mounting thereof, the electrical conduction between the extended portion 30 of the wired circuit body portion 2 and the semiconductive layer 9 of the electrostatic charge removing portion 3 can be cut off by separating the electrostatic charge removing portion 3 from the wired circuit body portion 2 using the conduction cut-off portion 4 as a boundary, thereby allowing to prevent the main wired circuit 5 of the wired circuit body portion 2 from being electrically affected by the extended portion 30 (semiconductive layer 9).

In the above explanation, the wired circuit board of the present invention has been illustrated and described with the suspension board with circuit 1. However, the wired circuit board of the present invention is not limited thereto, and can be widely applied to other wired circuit boards, such as various flexible wired circuit boards having the metal supporting layer 12 provided as a reinforcing layer.

EXAMPLE

While in the following, the present invention is described in further detail with reference to Example and Comparative Example, the present invention is not limited to any of them by no means.

Example 1

A metal supporting layer of a stainless foil having a thickness of 20 µm was prepared (cf. FIG. 4(*a*)).

Subsequently, a varnish of photosensitive polyamic acid resin was uniformly coated over a surface of the metal supporting layer using a spin coater. The coated varnish was then heated at 90° C. for 15 minutes to form a base coating. Thereafter, the base coating was exposed to light at 700 mJ/cm$^2$ via a photomask, and then heated at 190° C. for 10 minutes. The base coating thus heated was developed using an alkaline developer. Subsequently, the coating was cured at 385° C. under the pressure reduced to 1.33 Pa, thereby forming an insulating base layer of polyimide on the metal supporting layer to correspond to a portion where a conductive pattern was formed, and to provide the above-mentioned pattern in which base openings are formed (cf. FIG. 4(*b*)). The insulating base layer thus formed had a thickness of 10 µm. Each of the base openings had a rectangular shape in plane view having a width of 80 µm, and a length of 300 µm.

Next, a conductive pattern of a copper foil having a thickness of 10 µm was formed on the upper surface of the insulating base layer in the above-mentioned pattern (patterns of the main wired circuit and the auxiliary wired circuit) by an additive method. At the same time, a ground connecting portion of copper was formed on the metal supporting layer exposed from each of the base openings so that the lower portion thereof filled the base openings in the insulating base layer, and so that the upper portion thereof covered the circumferences of the base openings in the insulating base layer (cf. FIG. 4(*c*)).

Each of the spacing between the wirings and the spacing between the auxiliary wirings was 100 µm, and each of the wiring and the auxiliary wiring had a width of 30 µm. Each of the spacing between the magnetic-head-side connecting terminal portions, the spacing between the external connecting terminal portions, and the spacing between the test-side connecting terminal portions was 25 µm. Each of the magnetic-head-side connecting terminal portion, the external connecting terminal portion, and the test-side connecting terminal portion had a width of 25 µm. Both the upper portion and the lower portion of each ground connecting portion had a rectangular shape in plane view. The lower portion thereof had a width of 80 µm, and a length of 300 µm. The upper portion thereof had a width of 140 µm, a length of 360 µm, and a thickness of 10 µm.

Next, a sputtering coating of a thin chromium film was formed on the respective surfaces of the conductive pattern, the ground connecting portion, the insulating base layer, and the metal supporting layer by the sputtering using chromium as a target.

The sputtering was performed according to the method described in Japanese Unexamined Patent Publication No. 2004-335700 under the following conditions:
Target: Cr
Ultimate vacuum: $1.33 \times 10^{-3}$ Pa
Flow rate of introduced gas (Argon): $2.0 \times 10^{-3}$ m$^3$/h
Operating pressure: 0.16 Pa
Temperature of earth electrode: 20° C.
Electric power: DC 500 W
Sputtering time: 3 seconds
Thickness of sputtering coating: 100 nm Next, a semiconductive layer of a chromium oxide layer was formed by heating in the atmosphere at 125° C. for 12 hours, thereby oxidizing the surface of the sputtering coating of a thin chromium film (cf. FIG. 4(*d*)). The chromium oxide layer had a thickness of 100 nm.

The formation of the semiconductive layer of the chromium oxide layer was confirmed by ESCA. When the surface resistance value of the semiconductive layer thus formed was measured at a temperature of 25° C. and a humidity of 15% using a surface resistance measuring device (Hiresta-up MCP-HT450 available from Mitsubishi Chemical Corporation), the value was $1 \times 10^7 \Omega/\square$.

Next, the varnish of the photosensitive polyamic acid resin described above was uniformly coated over the surface of the semiconductive layer using a spin coater, and then heated at 90° C. for 10 minutes to form a first cover coating having a thickness of 4 µm. Thereafter, the first cover coating was exposed to light at 700 mJ/cm$^2$ via a photomask, and then heated at 180° C. for 10 minutes. The first cover coating thus heated was then developed using an alkaline developer to pattern the cover coating. Subsequently, the coating was cured at 385° C. under the pressure reduced to 1.33 Pa. As a result of this, a first insulating cover layer of polyimide was formed on the semiconductive layer in an electrostatic charge removing portion (except for a front end portion thereof) in the above-mentioned pattern (cf. FIG. 4(*e*)). The first insulating cover layer had a rectangular shape in plane view, a width of 660 µm, a length of 2070 µm, and a thickness of 4 µm.

Next, the semiconductive layer exposed from the first insulating cover layer was removed by wet etching using the first insulating cover layer as an etching resist and using a potassium hydroxide aqueous solution (cf. FIG. 5(*f*)). As a result of this, the semiconductive layer was formed in the above-mentioned pattern in the same position as the first insulating cover layer corresponding to the rectangular shape of the first insulating cover layer in plane view.

Next, a second insulating cover layer was formed on the insulating base layer so as to cover the first insulating cover layer in the electrostatic charge removing portion and so as to cover a conductive pattern in the wired circuit body portion, thereby forming an insulating cover layer including the first insulating cover layer and the second insulating cover layer in the above-mentioned pattern (cf. FIG. 5(*g*)). The second insulating cover layer had a thickness of 5 µm.

Next, a metal supporting layer was opened by wet etching to form a metal opening (cf. FIG. 5(h)), and thereafter, perforated notches were formed in the insulating base layer and the insulating cover layer of a conduction cut-off portion by a UV laser ablation method (cf. to FIG. 5(*i*)).

Thereafter, the metal supporting layer was cut out by chemical etching, and also trimmed to obtain a suspension board with circuit (cf. FIG. 1).

Comparative Example 1

A suspension board with circuit was produced as in Example 1 except that the first insulating cover layer was not provided and the semiconductive layer was not etched, in the production of the suspension board with circuit in Example 1, (cf. FIG. 13).

That is, the semiconductive layer was continuously formed over the wired circuit body portion and the electrostatic charge removing portion.

(Evaluation)

Evaluation on Electrical Stability (Electrical Stability of a Suspension Board with Circuit with Magnetic Head Mounted Thereon)

In the suspension boards with circuit obtained in Example 1 and Comparative Example 1, a magnetic head was mounted on the magnetic-head-side connecting terminal portion of the wired circuit body portion. Thereafter, the electrostatic charge removing portion was torn off along the notches in the conduction cut-off portion to cut off the electrical conduction between the wired circuit body portion and the electrostatic charge removing portion, whereby the electrostatic charge removing portion was separated from the wired circuit body portion. Thereafter, a voltage of 6V from an external connecting terminal portion was applied to each of the suspension boards with circuit for 1000 hours under the atmosphere of 85° C. and 85% RH to measure the insulation resistance value between the wirings. Thus, the electrical stability of the wired circuit body portion was evaluated.

The result confirmed that the wired circuit body portion of Example 1 was stable even though 1000 hours or more passed after the application. On the other hand, in the wired circuit body portion of Comparative Example 1, the result confirmed that when 100 hours passed after the application, the insulation resistance value between the wirings became unstable due to copper migration.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising: a wired circuit body portion comprising: a wired circuit, a first terminal portion connected to the wired circuit and arranged on one side of the wired circuit body portion, and a second terminal portion connected to the wired circuit and arranged on the other side of the wired circuit body portion, wherein the wired circuit extends in a longitudinal direction in a region between the first terminal portion and the second terminal portion; an electrostatic charge removing portion conducted with the wired circuit body portion and having a semiconductive layer; and a frangible conduction cut-off portion arranged between the wired circuit body portion and the electrostatic charge removing portion to cut off electrical conduction therebetween, wherein a notch is formed in the frangible conduction cut-off portion; and wherein the electrostatic charge removing portion is arranged outside of the region between the first terminal portion and the second terminal portion where the wired circuit extends in the longitudinal direction, such that the electrostatic charge removing portion comprises a removable end portion that extends from at least one longitudinal end of the wired circuit body portion and is separated from the wired circuit body portion at the frangible conduction cut-off portion as a boundary when torn off and removed.

2. The wired circuit board according to claim 1, wherein the electrostatic charge removing portion comprises a conductive layer connected to the wired circuit and an insulating layer laminated on the conductive layer, and the semiconductive layer is formed on the conductive layer and/or the insulating layer.

3. The wired circuit board according to claim 2, wherein the electrostatic charge removing portion further comprises a metal supporting layer, and the semiconductive layer is electrically connected with the metal supporting layer.

4. The wired circuit board according to claim 2, wherein the electrostatic charge removing portion comprises a third terminal portion connected to the conductive layer.

5. The wired circuit board according to claim 4, wherein the electrostatic charge removing portion comprises a third terminal portion forming portion having the third terminal portion formed thereon, a semiconductive layer forming portion arranged between the third terminal portion forming portion and the frangible conduction cut-off portion to form the semiconductive layer thereon, and an auxiliary conduction cut-off portion arranged between the third terminal portion forming portion and the semiconductive layer forming portion to cut off the electrical conduction therebetween.

6. The wired circuit board according to claim 5, wherein the third terminal portion forming portion is separable from the semiconductive layer forming portion at the auxiliary conduction cut-off portion as a boundary.

7. The wired circuit board according to claim 5, wherein at least one notch is formed in the auxiliary conduction cut-off portion to facilitate tearing off and removal of the third terminal portion forming portion from the semiconductive layer forming portion.

* * * * *